(12) United States Patent
Udrea et al.

(10) Patent No.: US 12,745,449 B2
(45) Date of Patent: Sep. 22, 2026

(54) CURRENT SENSING IN POWER SEMICONDUCTOR DEVICES

(71) Applicant: Cambridge GaN Devices Limited, Cambridge (GB)

(72) Inventors: Florin Udrea, Cambridge (GB); Loizos Efthymiou, Cambridge (GB); Martin Arnold, Cambridge (GB); John Findlay, Cambridge (GB); Sheung Wai Fung, Cambridge (GB); Tara Vishin, Cambridge (GB); Paul Ryan, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 798 days.

(21) Appl. No.: 17/986,308

(22) Filed: Nov. 14, 2022

(65) Prior Publication Data

US 2024/0162224 A1 May 16, 2024

(51) Int. Cl.

*H10D 62/85* (2025.01)
*H10D 30/47* (2025.01)
*H10D 84/80* (2025.01)

(52) U.S. Cl.

CPC ......... *H10D 84/817* (2025.01); *H10D 30/475* (2025.01); *H10D 62/8503* (2025.01)

(58) Field of Classification Search

CPC ............... H10D 84/817; H10D 30/475; H10D 62/8503; H10D 30/83; H10D 62/124;

(Continued)

(56) References Cited

U.S. PATENT DOCUMENTS 4,525,678 A * 6/1985 Lehmann ................ H03F 3/601 330/296
4,783,690 A 11/1988 Walden (Continued)

FOREIGN PATENT DOCUMENTS

TW 200818490 A 4/2008
TW 200905769 A 2/2009

(Continued)

OTHER PUBLICATIONS

GB Search Report for GB application No. GB2317429.5, dated May 7, 2024, 4 pages.

(Continued)

*Primary Examiner* — Sheikh Maruf
(74) *Attorney, Agent, or Firm* — Renner, Otto, Boisselle & Sklar LLP

(57) ABSTRACT

An III-nitride power semiconductor based heterojunction device comprising a first heterojunction and a second heterojunction transistor, wherein the second heterojunction transistor has a substantially identical structure to the first heterojunction transistor, and wherein the second heterojunction transistor is scaled to a smaller area or gate perimeter than the first heterojunction transistor by a scale factor X, where X is larger than 1. The heterojunction device further comprises a resistive operatively connected between the heterojunction transistors a monolithically integrated level shifting stage configured to receive an input signal corresponding to a signal across the resistive load and output a level shifted signal that corresponds to the input signal, and an amplifier stage configured to receive the level shifted signal as an input and provide an output signal to an output node of the heterojunction device, wherein the output signal of the amplifier stage is proportional to the signal across the resistive load.

29 Claims, 14 Drawing Sheets

(58) Field of Classification Search

CPC .... H10D 62/343; H10D 62/126; H10D 84/82; H10D 84/811; H10D 84/01; H10D 84/05; H10D 30/47; G01R 19/0092; H01L 22/34

USPC .......................................................... 438/368

See application file for complete search history.

(56) References Cited

U.S. PATENT DOCUMENTS

| | | | | |
|---|---|---|---|---|
| 6,433,386 | B1 | 8/2002 | Yun | |
| 8,470,652 | B1 * | 6/2013 | Brown | H01L 21/02002 438/172 |
| 10,693,447 | B1 * | 6/2020 | Hao | H03K 5/2472 |
| 10,818,786 | B1 | 10/2020 | Udrea | |
| 11,081,578 | B2 | 8/2021 | Udrea | |
| 11,082,039 | B2 | 8/2021 | Chen et al. | |
| 11,217,687 | B2 | 1/2022 | Udrea | |
| 11,404,565 | B2 | 8/2022 | Udrea | |
| 2005/0286194 | A1 * | 12/2005 | Fujiki | H03K 17/0822 257/E29.136 |
| 2009/0072272 | A1 * | 3/2009 | Suh | H10D 30/4732 257/E21.409 |
| 2010/0072517 | A1 * | 3/2010 | Zampardi | H10D 84/038 257/197 |
| 2011/0210377 | A1 * | 9/2011 | Haeberlen | H10D 84/01 257/E21.403 |
| 2011/0248283 | A1 * | 10/2011 | Cao | H10D 64/251 257/E29.089 |
| 2012/0228625 | A1 * | 9/2012 | Ikeda | H10D 62/824 257/E29.089 |
| 2012/0292665 | A1 * | 11/2012 | Marino | H10D 62/221 257/E21.409 |
| 2012/0306545 | A1 * | 12/2012 | Machida | H02M 3/1588 327/109 |
| 2013/0161698 | A1 * | 6/2013 | Marino | H10D 64/517 257/E21.403 |
| 2014/0015586 | A1 * | 1/2014 | Hirler | H10D 84/401 327/333 |
| 2017/0155383 | A1 * | 6/2017 | Andrys | H03G 3/007 |
| 2017/0338823 | A1 * | 11/2017 | Reinhold | H02M 3/07 |
| 2018/0280658 | A1 * | 10/2018 | Govari | A61N 1/04 |
| 2019/0140130 | A1 * | 5/2019 | Bessonov | H10F 30/2877 |
| 2019/0140630 | A1 * | 5/2019 | Chen | H03K 17/08104 |
| 2019/0238119 | A1 * | 8/2019 | Chern | H03K 3/011 |
| 2019/0245382 | A1 * | 8/2019 | Liu | G01R 19/0092 |
| 2019/0267482 | A1 | 8/2019 | Udrea et al. | |
| 2019/0280658 | A1 | 9/2019 | Morisawa et al. | |
| 2019/0305758 | A1 * | 10/2019 | Chen | H02M 3/07 |
| 2020/0052702 | A1 * | 2/2020 | Hekmatshoartabari | H03K 19/018521 |
| 2020/0228012 | A1 * | 7/2020 | Lynch | H02M 3/158 |
| 2020/0357907 | A1 * | 11/2020 | Udrea | H10D 84/811 |
| 2020/0381418 | A1 | 12/2020 | Schneider et al. | |
| 2021/0067101 | A1 * | 3/2021 | Chien | H03F 3/45376 |
| 2021/0335781 | A1 * | 10/2021 | Arnold | H10D 30/475 |
| 2022/0208761 | A1 | 6/2022 | Udrea et al. | |
| 2022/0317162 | A1 | 10/2022 | Yamada et al. | |
| 2023/0198515 | A1 * | 6/2023 | Delaine | H03K 17/08122 327/427 |
| 2023/0314486 | A1 * | 10/2023 | Bergogne | G01R 19/14 324/133 |

FOREIGN PATENT DOCUMENTS

| | | | |
|---|---|---|---|
| TW | 201108584 | A | 3/2011 |
| TW | 201515186 | A | 4/2015 |
| TW | 201711201 | A | 3/2017 |
| TW | 201909423 | A | 3/2019 |
| WO | 2012137670 | A1 | 10/2012 |
| WO | 2020225362 | A1 | 11/2020 |
| WO | 2022049344 | A1 | 3/2022 |

OTHER PUBLICATIONS

TW Office Action for TW application No. 11320684640, dated Jul. 4, 2024, 5 pages.

Biglarbegian Mehrdad et al., “Characterization of SenseGaN current-mirroring for power GaN with the virtual grounding in a boost converter”, 2017 IEEE Energy Conversion Congress and Exposition (ECCE), IEEE, Oct. 1, 2017, pp. 5915-5919, XP033247613, DOI: 10.1109/ECCE.2017.8096977, retrieved on Nov. 3, 2017, figures 1, 2.

LU Search Report and Written Opinion for corresponding LU Application No. 503054, dated Jun. 20, 2023, pp. 1-8.

* cited by examiner

CURRENT SENSING IN POWER SEMICONDUCTOR DEVICES

FIELD OF THE DISCLOSURE

The present disclosure relates to power semiconductor devices and current sensing in power semiconductor devices. Particularly, but not exclusively, the disclosure relates to the use of a hetero-structure AlGaN/GaN high electron mobility transistor for current sensing applications.

BACKGROUND OF THE DISCLOSURE

Gallium Nitride (GaN) is a wide band gap material suitable for power and RF semiconductor devices. GaN technology allows the design of transistors with high electron mobility and a high saturation velocity, both of which are, generally, useful traits in the field of power and Radio-Frequency (RF) electronics. The use of GaN material has additional advantages in power devices. For example, the wide band gap of the material ($E_g$=3.39 eV) results in high critical electric field ($E_c$=3.3 MV/cm), which can allow the design of devices with a shorter drift region (and therefore a lower on-state resistance) compared to silicon-based devices with the same breakdown voltage.

The use of an Aluminium Gallium Nitride (AlGaN)/GaN heterostructure also allows the formation of a two-dimensional electron gas (2DEG) at the hetero-interface where carriers can reach very high carrier mobility values (e.g. $\mu$=2000 $cm^2/(Vs)$). In addition, the piezopolarization charge present at the AlGaN/GaN heterostructure can result in a high electron density in the 2DEG layer (e.g. $1e^{13}$ $cm^{-2}$). These properties allow the development of High Electron Mobility Transistors (HEMTs) and Schottky barrier diodes with very competitive performance parameters. An extensive amount of research has focused on the development of power devices using AlGaN/GaN heterostructures, resulting in several technologies that enable normally on (Schottky gate based technology) and normally off (insulated gate and p-GaN gate technology) HEMT devices. It will be understood that normally off devices may also be referred to as enhancement mode devices, while normally on devices may also be referred to as depletion mode devices.

In power electronics it is sometimes desirable for protection and sensing circuitry (such as current sensing, overvoltage protection, temperature sensing) to be integrated with the main (often enhancement mode) power switch. Monolithic integration of such functionality, rather than a discrete implementation, allows a reduction in the overall system size and/or costs, e.g. due to a reduction in the bill of material, and often results in improved performance through the reduction of parasitic components associated with the interconnections between discrete devices.

In some current sensing devices, a sensing resistor is provided to assist in the detection and/or measurement of a current. The current sensing signal ($V_{CS}$) across the sensing resistor is generally proportional to the current through the sensing resistor. Ideally, the current through the sensing resistor is a constant fraction of the current through the main power device across the entire intended current range, and across the entire desired operational temperature range (e.g. −55 C to 150 C).

However, there exists a trade-off in existing current sensing devices between the sensitivity of the device on one hand, and the linearity of the current sensing/accuracy with varying conditions on the other. This is because a high $V_{CS}$ signal increases the sensitivity of the device, while a low $V_{CS}$ signal improves the linearity of the current sensing signal and the accuracy of the current sensing signal with respect to temperature and manufacturing-process variations. From a linearity and accuracy perspective, the signal $V_{CS}$ is ideally close to zero volts, such that the current through a sensing HEMT is a constant fraction of the current through the main power device across the whole range of currents.

The signal $V_{cs}$ may be influenced by temperature for several reasons. For example, the resistance of any several components used in the current sensing device, such as transistors and resistors, may vary with temperature. Additionally, the precise current sharing ratio between e.g. a main HEMT transistor and a current sensing HEMT transistor may also vary with temperature.

Moreover, unlike Silicon-based or other semiconductor-based power devices, GaN HEMTs suffer from a condition known as dynamic on-state resistance ($R_{on}$). This condition can be described as a variation in the on-state resistance when a prior high voltage stress is applied to the main device. The dynamic on-state resistance is important in the context of device power losses during long-term operation, but it can also play a second order effect in current sensing operations. For example, when a high voltage stress is applied, only the main HEMT and the current sensing transistor of a GaN device are affected by the dynamic $R_{on}$, while the sensing load resistance $R_{CS}$ is virtually unaffected. This further deteriorates the linearity of the current sensing across the current range, and the accuracy of the current sensing with respect to temperature.

As such, the Applicant has therefore recognised a need for a current sensing device with an improved trade-off between sensitivity and measurement accuracy across a range of conditions.

U.S. Pat. No. 4,783,690 (A) describes a power semiconductor device incorporates in its active, or current-carrying, region a main current section and an emulation current section.

U.S. Pat. No. 6,433,386 (B1) describes a sense field-effect transistor (FET) that is capable of achieving many available sense current ratios after manufacture, and a method of manufacturing the same. The sense FET includes a main cell array of metal-oxide-semiconductor field-effect transistor (MOSFET) cells connected in parallel, and a main pad connected to the sources of the main cells.

U.S. Pat. No. 10,818,786 (B1) describes a III-nitride semiconductor based heterojunction power device, comprising a first heterojunction transistor formed on a substrate and a second heterojunction transistor formed on a substrate, wherein the second heterojunction transistor is used in sensing and protection functions of the first power heterojunction transistor.

US2022/0208761 (A1) describes an III-nitride semiconductor based heterojunction power device, comprising: a first heterojunction transistor formed on a substrate and a second heterojunction transistor formed on a substrate, wherein the second heterojunction transistor is used in sensing and protection functions of the first power heterojunction transistor. The device also includes a monolithically integrated current sensing transistor that has a substantially identical structure to the first heterojunction transistor, and wherein the current sensing transistor is scaled to a smaller area or a shorter gate width when compared to the first heterojunction transistor.

U.S. Pat. No. 11,081,578 (B1) describes a depletion mode III-nitride semiconductor based heterojunction device, comprising a substrate; a III-nitride semiconductor region formed over the substrate, and at least two highly doped semiconductor regions spaced apart from each other.

U.S. Pat. Nos. 11,217,687 (B1) and 11,404,565 (B1) describe an integrated auxiliary gate terminal and a pull-down network to achieve a normally-off (E-Mode) GaN transistor with threshold voltage higher than 2V, low gate leakage current and enhanced switching performance.

SUMMARY

The present disclosure generally relates to semiconductor structures and devices formed in Group III nitrides, such as GaN and $Al_xGaN_{1-x}$ structures, and more specifically to heterostructures using two dimensional electron gas layers (2DEG). Heterojunction power devices are high voltage HEMTs.

According to a first aspect of the present disclosure there is provided a heterojunction III nitride high voltage/power device comprising:

- a main power transistor, comprising a main drain terminal, a main source terminal and a main gate terminal;
- a resistive sensing load;
- a sensing transistor with its drain connected to the main drain terminal, its gate connected to the main gate terminal and its source connected to a first terminal of the resistive sensing load;
- a level shifter structure which level shifts the voltage signal across the resistive sensing load;
- an amplifier structure which has at least one input connected to the level shifter structure and at least one output connected directly or indirectly through other components to an output current sensing node; and wherein:
  - the second terminal of the sensing load is connected to the source terminal of the main power transistor;
  - the sensing transistor has a similar architecture to the main power transistor but has a significantly lower area, or gate perimeter, by a designed ratio; and
  - the said output signal from the amplifier is largely directly proportional to the current through the main power transistor.

The sensing transistor having a similar architecture to the main power transistor means that the sensing transistor and main power transistor have substantially identical structures. However, the sensing transistor is scaled to a different area or gate perimeter than the main power transistor by a given scale factor X. The scale factor X being larger than 1 means that the sensing transistor is smaller than the main power transistor by that factor. For example, a scale factor of 2 would mean that the area or gate perimeter of the main hetero junction is twice the size of the sensing transistor. Conversely, a scale factor less than 1 would mean that the sensing transistor is larger than the main power transistor.

A sensitivity S of a current sensing device may be defined as the ratio between the output (voltage) signal $V_{cs}$ and the current through the main power device $I_{main}$, such that:

$$S = \frac{V_{CS}}{I_{main}} \tag{1}$$

For a current sensing device, an "ideal" linearity means that sensitivity of the current sensing is linear across the entire current range, i.e. that the derivative of the sensitivity with respect to current ($dS/dI_{main}$) is or is close to being a constant value across the whole current range of the device. The linearity of the signal may therefore be defined as a measure of how close this derivative is to being a constant value across the current range.

With an ideal linearity, the signal $V_{cs}$ is an accurate measure of the current through the main power device across the entire current range, as $V_{CS}$ is linearly increasing with the current through the main power device. In reality, the signal $V_{CS}$ is not perfectly linear for many reasons, several of which are discussed below. However, the closer the linearity is to being a constant value, the better the accuracy of the current sensing solution with respect to current.

One factor that can affect the linearity of the current sensing signal $V_{CS}$ is temperature. The accuracy of the signal $V_{CS}$ with respect to temperature may be defined as how close the derivative of the sensitivity with respect to temperature (dS/dT) is to being zero, i.e. such that an "ideal" accuracy with respect to temperature means that this derivative is zero across the whole temperature range and there is no variation in the linearity of the signal $V_{CS}$ with respect to temperature (at least across an expected or desired operating range of temperatures).

A further factor that can affect the linearity of the current sensing signal $V_{CS}$ is (manufacturing) process variation. In this context, process variation refers to a generic parameter that describes variability in the structure of the current sensing device, such as differences between metal layers, 2DEG charges, doping profiles, trap distribution within different semiconductor layers or at interfaces and gate leakage between devices on the same chip, on the same wafer or from wafer to wafer or from batch to batch. The accuracy of the signal $V_{CS}$ with respect to process variation may be defined as how close the derivative of the sensitivity with respect to process variation (dS/dPV) is to being zero, i.e. such that an "ideal" accuracy with respect to process variation means that this derivative is zero across the whole range of statistical process variation and there is no variation in the linearity of the signal $V_{CS}$ with respect to process variations.

It is therefore an object of this invention to provide a monolithically integrated circuit that is able to maintain high linearity, accuracy and high sensitivity across the desirable current and temperature range, and offer a high degree of immunity against changes in dynamic resistances. This is achieved in this aspect through the use of an amplifier stage, which facilitates the use of a low $V_{CS}$ signal to improve the linearity of the current sensing signal and the accuracy of the current sensing signal with respect to temperature and manufacturing-process variations, while simultaneously providing a high output current sensing signal to increase the sensitivity of the current sensing solution.

All the transistors and other structures in the heterojunction device are monolithically integrated, to reduce parasitic components and further improve the accuracy of current sensing.

Any of the level shifter structures described herein may be configured to level shift the voltage or current signal across the resistive sensing load to a level higher by at least one threshold voltage of an enhancement heterojunction transistor (e.g. higher than 1V). As a result, the level shifter may shift the voltage or current signal to a level above the threshold value to the enhancement mode transistor, facilitating the use of enhancement mode transistors in the device, for example in the amplifier structure.

The power device may comprise at least one layer of AlGaN adjacent to a layer of GaN and wherein at the interface between the said AlGaN and GaN layer, a two-dimensional electron gas (2DEG) is present.

Isolation areas or regions may be provided between some of the transistors or other components to reduce interference between different devices due for example to the presence of fast transient signals. For example, main power device could be isolated from the sensing load and/or low-power transistors provided in level shifter/amplifying structure. The isolation region could be a region where the 2DEG is absent, for example by means of etching or doping appropriately. Additionally or alternatively, shield metal layers could be provided to reduce or, ideally, remove interference. Such shields could be for example made of metal layers connected to DC potentials (e.g. the ground).

An output load resistor may be provided between the current sensing output terminal and the source of the main power device. The output load resistor may be connected externally or integrated internally on the output sensing node. In some implementations, the output load resister is selected or configured such that its resistance has little variation in temperature across the whole temperature range of operation.

The amplifier structure may be or comprise a voltage amplifier or a current amplifier. The amplifier structure may be a differential amplifier structure, and may contain or comprise monolithically integrated op-amps, voltage repeaters based on op-amps, resistors and/or capacitors.

The amplifier structure may comprise components which match based on a ratiometric factor. As used herein, ratiometric matching refers to two components that are provided with similar or identical structures, but where one component is smaller or larger than the other component by a scaling factor (i.e. so that all aspects of the components differ in size by the same ratio). This matching can apply to the physical structure or the performance of the component (or both). In the amplifier structure, the ratiometric matching may occur between two resistive structures.

Where structures are matched (ratiometrically or otherwise), they may be provided in the same layer of the heterojunction device and positioned close to (e.g. adjacent with a small separation) one another. This may help to reduce process variations between the two matched components. For example, by providing the two resistive structures of the amplifier structure in this way, their resistive variation with respect to temperature and/or process variations may be configured to largely or entirely cancel out.

The level shifter structure may comprise one or more, e.g. several, low voltage diodes in series. Alternatively, the level shifter may comprise one or more, e.g. several, enhancement-more transistors in series and connected in a diode configuration, such that their gate terminals are short-circuited to their source terminals.

The level shifter may be configured to perform both a level shifting function and an initial amplification function, and may comprise one or more, e.g. several, low voltage depletion mode transistors for use in this initial amplification function. The low voltage depletion mode transistors may be any suitable transistor, for example a Schottky gate transistor or a transistor comprising multiple p+ GaN islands between a source terminal and a drain terminal.

According to a second aspect of the present disclosure, there is provided a heterojunction III-nitride high voltage/power device comprising:

- a main power transistor, comprising a main drain terminal, a main source terminal and a main gate terminal;
- a resistive sensing load;
- a sensing transistor with its drain connected to the main drain terminal, its gate connected to the main gate terminal and its source connected to a first terminal of the resistive sensing load;
- a bridge circuit comprising two legs and mid points between the upper part of each leg and lower part of each leg, wherein:
  - the lower part of the first leg of the bridge circuit comprises a first level shifter structure which is configured to level shift the signal across the resistive sensing load;
  - the lower part of the second leg of the bridge circuit comprises a second level shifter structure which is configured to provide a reference signal, wherein the second level shifter structure has at least one component which is matched (or ratiometrically matched) in geometry and performance, and optionally placed side by side to, an identical component within the first level shifting structure; and an amplifier structure which has one input connected to the first level shifter structure via the mid-point of the first leg and another input connected to the second level shifter structure via the mid-point of the second leg, and at least one output connected directly or indirectly thorough other components to an output current sensing node; and wherein
  - wherein the second terminal of the sensing load is connected to the source terminal of the main power transistor;
  - the sensing transistor has a similar architecture to the main power transistor but has a significantly lower area, or gate perimeter, by a designed ratio;
  - the voltage signal across the said resistive sensing load is largely directly proportional to the current through the main power transistor; and
  - the said output signal from the differential amplifier is largely directly proportional to the signal across the resistive sensing load.

As used herein, components being placed or sitting side by side refers to two or more components that are in a close enough proximity to reduce process variations between the components and thereby improve component matching. For example, the components may be placed or formed with a separation of 100 μm or less.

A bridge circuit (such as Whetstone bridge) may be used for measuring unknown resistances or changes in resistances. A bridge circuit may comprise a two-leg (or two-arm) structure, each leg featuring a lower part and an upper part separated by a mid-point. The tops of the upper parts of the legs of the bridge circuit (i.e. the ends of the upper parts which are not connected to the mid-point) may be connected to a common node, which is further connected to a low-voltage DC rail (VDD). The bottoms of the two lower parts of the legs of the bridge circuit (i.e. the ends of the lower parts which are not connected to the mid-point) may be connected to a common node, which is further connected to a lower DC level than VDD (e.g. a ground level). An active leg of the bridge circuit is a leg which either comprises the sensing resistive load or a component which is controlled by the voltage across the sensing resistive load (which in turn is controlled by the current through the main power device).

The bridge circuit may be said to be balanced when the mid-points on the two legs are at the same potential. When for example one variable is changed in one of the parts of the active leg, the bridge is or becomes unbalanced and the change in the variable can be measured by the voltage drop across the mid-points of the bridge. This voltage drop may in turn be amplified to improve the sensitivity of the signal.

The upper parts of the first and second legs may comprise resistances, or transistors used as resistors or current sources with components matched (or ratiometrically matched) in geometry and performance, and optionally placed side by side.

The lower part of the first leg of the bridge may comprises any one or more or a series of any of the following components: diodes, transistors connected in a diode configuration, resistors, depletion mode transistor and at least one of these components may either be the sensing resistive load or be controlled through the voltage drop across the sensing resistive load. The lower part of the second leg may comprise matched or ratiometrically matched components to a corresponding component in the lower part of the first leg.

Similarly, the upper part of the first leg of the bridge may comprise any one or more or a series of any of the following components: resistors, depletion mode transistor connected in a resistive configuration, and current sources. The upper part of the second leg may comprise an identical, matched or ratiometrically matched component to a corresponding component in the upper part of the first leg.

The amplifier structure may comprise at least one operational amplifier (op-amp) structure, wherein the operational amplifier has one input connected to the first level shifter structure (e.g. via the mid-point of the first leg) and the second input connected to the second level shifter structure (e.g. via the mid-point of the second leg). The amplifier may further comprise at least one other transistor and/or a potential divider, wherein the upper side of the potential divider is connected to the output current sensing node.

Additionally or alternatively, the amplifier structure may comprise at least a resistive component which converts a voltage drop between repeated potentials (e.g. a buffered potential) at the midpoints of the bridge into an output current to ensure that the output current is proportional to the main input current through the main power transistor, and further proportional to the resistance of the sensing load (and inverse proportional to the resistance of the resistive component). As used herein, repeated potentials refer to output potentials of operational amplifiers used in a unity buffer configuration.

The amplifier structure may be a differential amplifier structure comprising one or more operational amplifiers. The one or more amplifiers may be connected or configured as amplifiers (i.e. with larger than unity amplification). Additionally or alternatively, the differential amplifier structure may comprise buffers or repeaters with a unity (or approximately or substantially unity) amplification. At least one of any such repeaters may be connected to a midpoint of one of the legs of the bridge circuit.

The level shifter in the lower part of the first leg may comprise a low-voltage transistor with its gate terminal connected to one end of the sensing load. The level shifter in the lower part of the second leg may comprise a matched or ratiometrically matched low-voltage depletion mode transistor with its gate terminal connected to source terminal of the main power transistor. Alternatively, the gate terminal of the low-voltage depletion mode transistor may be connected to a signal from a mid-point of a potential divider (e.g. in the amplifier structure).

The bridge may be balanced when the current through the main power transistor is nil. This means that there are equal potentials on the two mid-points of the bridge and hence zero volts on the output of a differential amplifier (as the two input potentials for the amplifier are equal).

According to a third aspect of the present disclosure, there is provided a heterojunction III-nitride high voltage/power device comprising:

- a main power transistor, comprising a main drain terminal, a main source terminal and a main gate terminal;
- a resistive sensing load;
- a sensing transistor with its drain connected to the main drain terminal, its gate connected to the main gate terminal and its source connected to a first terminal of the resistive sensing load;
- a bridge circuit comprising two legs and mid points between the upper part of each leg and lower part of each leg, wherein:
  - the lower part of the first leg of the bridge circuit comprises a first level shifter structure comprising at least one first depletion mode transistor which is configured to level shift the signal across the resistive sensing load;
  - the lower part of the second leg of the bridge circuit comprises a second level shifter structure which is configured to provide a reference signal, wherein the second level shifter structure comprises at least one second depletion mode transistor where the at least first and second depletion mode transistors are matched (or ratiometrically matched) in geometry and performance, and optionally placed side by side; and
- an amplifier structure which comprises at least one operational amplifier (op-amp) structure, wherein the operational amplifier has one input connected to the first level shifter structure via a mid-point of the first leg and a second input connected to the second level shifter structure via a mid-point of the second leg, and at least one output connected directly or indirectly thorough at least one other component to an output current sensing node; wherein
  - the amplifier structure comprises at least one transistor and a potential divider, wherein the upper side of the potential divider is connected to the output current sensing node;
  - the gate terminal of the first depletion mode transistor is connected to the first terminal of the resistive sensing load and the gate terminal of the second depletion mode transistor is connected to the mid-point of the potential divider;
  - the potential divider contains at least two resistive components ratiometrically matched in geometry and performance, and optionally placed side by side, whereby the amplification of the amplifier is largely (or approximately) proportional to ratio between the resistances of the two said resistive components of the potential divider; and
  - wherein the second terminal of the sensing load is connected to the source terminal of the main power transistor;
  - wherein the sensing transistor has a similar architecture to the main power transistor but has a significantly lower area, or gate perimeter, by a designed ratio;
  - wherein the voltage signal across the said resistive sensing load is largely directly proportional to the current through the main power transistor;
  - wherein the said output signal from the amplifier is largely directly proportional to the signal across the resistive sensing load.

The upper parts of the first and second legs may comprise resistances, or transistors used as resistors or current sources with matched components (or ratiometrically matched) in geometry and performance and optionally placed side by side.

The at least one other transistor may have the drain terminal connected to the rail voltage (VDD), the source terminal connected to the output sensing node and its gate potential connected to the output terminal of the operational amplifier.

According to a fourth aspect of the present disclosure, there is provided a heterojunction III-nitride high voltage/power device comprising:

- a main power transistor, comprising a main drain terminal, a main source terminal and a main gate terminal;
- a resistive sensing load;
- a sensing transistor with its drain connected to the main drain terminal, its gate connected to the main gate terminal and its source connected to a first terminal of the resistive sensing load;
- a bridge circuit comprising two legs and mid points between the upper part of each leg and lower part of each leg, wherein:
  - the lower part of the first leg of the bridge circuit comprises the resistive sensing load and a first level shifter structure in series with the resistive sensing load, the first level shifter is configured to level shift the signal across the resistive sensing load;
  - the lower part of the second leg of the bridge circuit comprises a second level shifter structure which is configured to provide a reference signal, wherein the second level shifter structure comprises a reference resistive component in series with a second level shifter structure where the resistive sensing load and the reference resistive components are matched (or ratiometrically matched) in geometry and performance and optionally placed side by side;
  - a differential amplifier structure which comprises at least one operational amplifier (op-amp) structure, wherein the differential amplifier has one input connected to the first level shifter structure via the mid-point of the first leg, and a second input connected to the second level shifter structure via a mid-point of the second leg, and at least one output connected indirectly thorough at least one other component to an output current sensing node, the differential amplifier structure comprising at least one transistor and a potential divider, where the upper side of the potential divider is connected to the output current sensing node, the potential divider comprises at least two resistive components ratiometrically matched in geometry and performance, and optionally placed side by side, whereby the amplification of the amplifier is largely (or approximately) proportional to ratio between the resistances of the two said resistive components of the potential divider; and wherein
  - the second terminal of the sensing load is connected to the source terminal of the main power transistor;
  - the sensing transistor has a similar architecture to the main power transistor but has a significantly lower area, or gate perimeter, by a designed ratio; and wherein the voltage signal across the said resistive sensing load is largely directly proportional to the current through the main power transistor; and
  - the said output signal from the amplifier is largely directly proportional to the signal across the resistive sensing load.

The differential amplifier structure may contain one or more operational amplifiers. Such operational amplifiers may be used for amplification or as repeaters (i.e. voltage buffers with amplification close to unity). In one implementation, the differential amplifier contains two op-amps in a repeater configuration, each of the op-amps having an input connection to each of the midpoints of the bridge. For example, the differential amplifier structure may comprise at least one first operational amplifier configured to receive the first input and at least one second operational amplifier configured to receive the second input, wherein an output of the first and second operational amplifiers are indirectly connected to the output node via at least one other component; and wherein the potential divider comprises an upper side and a lower side and a mid-point between the upper and lower sides, each of the upper and lower sides comprising one or more of the at least two resistive components, wherein the upper and lower sides are each operatively connected to the output node of one of the first and second operational amplifiers.

The at least one other transistor may have the drain terminal connected to the rail voltage (VDD), the source terminal connected to the output sensing node and its gate terminal connected to the output terminal of one of the operational amplifier.

The upper parts of the first and second legs may comprise resistors, or transistors used as resistors or current sources. Some or all of the components of the first and second legs may be matched components (or ratiometrically matched) in geometry and performance and optionally placed side by side.

The level shifter structures may comprise one or several diodes in series such as Schottky diodes or transistors behaving like diodes using their gate-source terminal connected together.

The sensing load and the resistive reference component may be resistors placed in close proximity for good matching (e.g. to reduce process variations are previously described). Such resistors may be made of any suitable structure, such as 2DEG, metal or other layers/materials (e.g. SiCr). The potential divider may comprise an upper side resistor R1 and lower side resistor R2. In implementations, the resistance of R1 may be significantly greater than R2.

According to a fifth aspect of the present disclosure, there is provided a heterojunction III-nitride high voltage/power device comprising:

- a main power transistor, comprising a main drain terminal, a main source terminal and a main gate terminal;
- a resistive sensing load;
- a sensing transistor with its drain connected to the main drain terminal, its gate connected to the main gate terminal and its source connected to a first terminal of the resistive sensing load;
  - a bridge circuit comprising two legs and mid points between the upper part of each leg and lower part of each leg, wherein:
  - the lower part of the first leg of the bridge circuit comprises the resistive sensing load and a first level shifter structure in series with the resistive sensing load, the first level shifter is configured to level shift the signal across the resistive sensing load;
  - the lower part of the second leg of the bridge circuit comprises a second level shifter structure which is configured to provide a reference signal, wherein the second level shifter structure comprises a reference resistive component in series with a second level shifter structure where the resistive sensing load and the reference resistive components are matched (or ratiometrically matched) in geometry and performance and optionally placed side by side;

a differential amplifier structure which comprises at least one operational amplifier (op-amp) structure, wherein the differential amplifier has one input connected to the first level shifter structure via the mid-point of the first leg, and a second input connected to the second level shifter structure via a mid-point of the second leg, and at least one output connected indirectly thorough at least one other component to an output current sensing node, the differential amplifier comprising at least one resistive component which is configured to convert a voltage drop between repeated potentials at the mid-points of the first and second legs into an output current which is proportional to the main input current through the main power transistor and further proportional to the resistance of the sensing load, and inversely proportional to the resistance of the said further resistive component; and wherein the second terminal of the sensing load is connected to the source terminal of the main power transistor;

the sensing transistor has a similar architecture to the main power transistor but has a significantly lower area, or gate perimeter, by a designed ratio;

the voltage signal across the said resistive sensing load is largely directly proportional to the current through the main power transistor; and the output current signal can be further converted into a voltage form (output voltage) by means of connecting a further (external or internal) output resistor, and wherein the output voltage is proportional to the further output resistor and largely directly proportional to the current through the main power transistor.

An offset cancellation circuit may be provided with any of the above aspects. The offset cancellation circuit may be connected to the output of the amplifier circuit, or otherwise monolithically integrated and connected within the amplifier circuit in front of the output signal. More generally, the offset cancellation circuit may be monolithically integrated, partly integrated, provided externally, either co-packaged with the power switch device or at PCB level.

According to a sixth aspect of the present disclosure, there is provided a heterojunction III-nitride high voltage/power device comprising:

a. a main power transistor, comprising a main drain terminal, a main source terminal and a main gate terminal;

b. a sensing transistor with its drain connected to the main drain terminal, its gate connected to the main gate terminal and its source connected to a first terminal of the resistive sensing load; and c. a current sensing circuit comprising either:

i. one or more amplifier stages; or ii. a current mirror circuit, a current multiplication circuit and a current subtractor circuit;

d. wherein the current sensing circuit is configured to receive a current across the sensing transistor and output a current sensing output to an output node.

As described above, for accurate current sensing it is generally desirable to maintain a constant current sharing ratio between the main power transistor and the current sense transistor. In implementations described above, the solution proposed to maintain a good current sharing relationship between the power path and the sense path was generally to keep the resistance of sense resistor small, which in turn results in a small $V_{cs}$ signal.

One approach for this is to provide the sensing current to an amplifier structure. In this implementation, the current is sensed directly from the sensing transistor. The amplifier stage (e.g. comprising an operational amplifier) maintains the positive and negative inputs at the same potential (i.e. the source potential). The output voltage of the sensing circuitry is therefore proportional to the current through the sensing transistor. If a single operational amplifier is provided, the output voltage may be inverted from the sensing current (i.e. such that a positive sensing current produces a negative output). To rectify this, some implementations provide a second operational amplifier, configured to receive the output of the first operational amplifier and provide a negative gain to the signal, such that a positive sensing current produces a positive output signal from the current sensing circuit.

An alternative approach discussed herein is to maintain the potential at the source of the sense transistor at the same level as the potential at the source of the power transistor, at all times during sensing operations. The current of the sensing transistor may then flow across a source potential and a negative potential. The sensing current may be combined with a low biasing current. The negative potential may be externally applied or generated internally to the device using e.g. integrated circuits. The negative supply can be supplied e.g. using a charge pump circuit. In its simplest form, a charge pump circuit is made of diodes, capacitors and requires a switching circuit.

The circuit block which combines the sensing current with a low biasing current may be defined a current mirror with feedback. The current may then be divided or multiplied, by a current multiplier or divider circuit. The current multiplier or divider circuit may also be implemented using one or more current mirror circuits. A current subtractor may be provided to produce an output current of proportional to the scaling factor applied by the current multiplier/divider circuit.

Optionally, an external resistor between the source of the main power transistor and the output node to convert the output current to an output voltage $V_O$.

The offset cancellation circuit may comprise any one or more of enhancement mode transistors, depletion mode transistors, resistors and/or capacitors, any of which may be monolithically integrated or placed externally or co-packaged. The offset cancellation circuit may comprise a combination of monolithically integrated, external and/or co-packaged components.

A stand-by circuit may also be provided with any of the above aspects. The stand-by circuit may be is monolithically integrated and configured such that, when a standby condition is detected (e.g. under a no load condition or operation), a signal is generated which disables or lowers the power consumption of at least one of the level shifter structures (such as the bridge circuit), or the amplifier circuit.

In any of the above aspects, the low voltage depletion mode transistor of the level shifter structure may comprise a source terminal, a drain terminal, and a plurality of highly doped semiconductor regions spaced apart from each and positioned between the source terminal and the drain terminal. The highly doped semiconductor regions may be configured to increase a length of a current path between the source terminal and the drain terminal across the active area of the transistor.

BRIEF DESCRIPTION OF THE DRAWINGS

The present disclosure will be understood more fully from the accompanying drawings, which however, should not be taken to limit the disclosure to the specific embodiments shown, but are provided for aiding in explanation and understanding only.

DETAILED DESCRIPTION OF THE PREFERRED EMBODIMENTS

Figure 1:
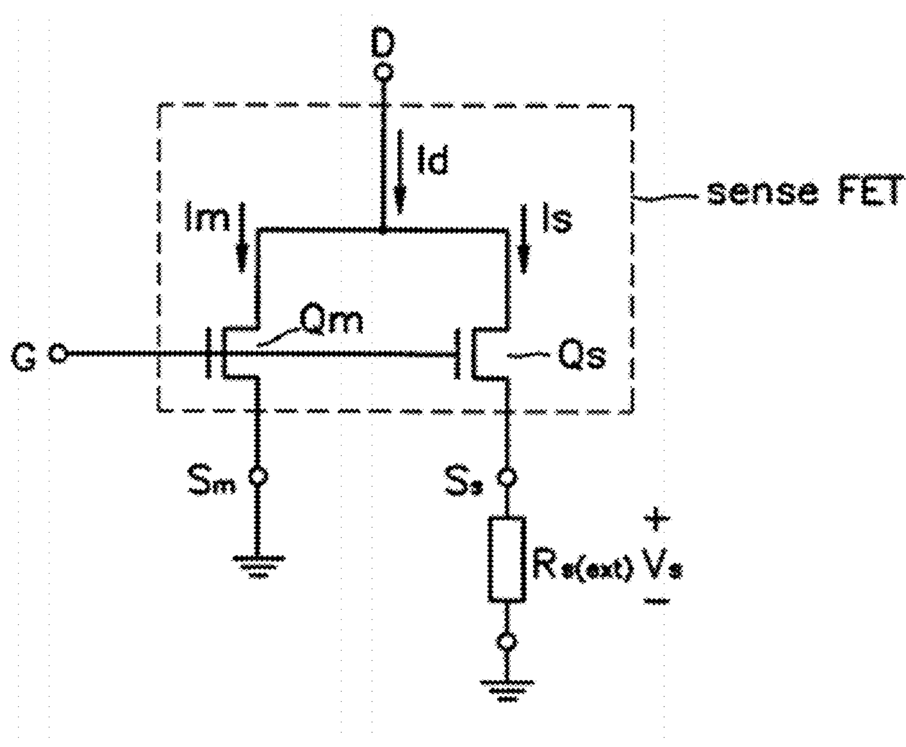
FIG. 1 depicts schematically an example sense Field Effect Transistor (FET).

FIG. 1 shows an example sense FET. The sense FET includes a main FET $Q_m$ and a Sub FET $Q_s$. The main FET and the sub FET are connected in parallel, but two sources are provided. Main Source $S_m$ of the main FET is grounded, while sense source $S_s$ of the sub FET is connected to an external sense resistor $R_{S(ext)}$, to detect a voltage drop $V_s$ of the sense resistor. An external connection for the $R_{S(ext)}$ is provided via a pin. The main and sub FETs are made from a number of identically structured cells, and therefore possess identical current-voltage characteristics. However, the main FET may be provided with many (e.g. hundreds or thousands) times the number of cells compared to the sub FET. As a result, the sub FET carries a current $I_s$ that is a predetermined percentage of the current $I_m$ carried by the main FET, since an on-resistance value of the MOSFET is inversely proportional to the number of cells in the FET, which means that the on-resistance value of the sub FET is much higher than that of main FET.

Figure 2:
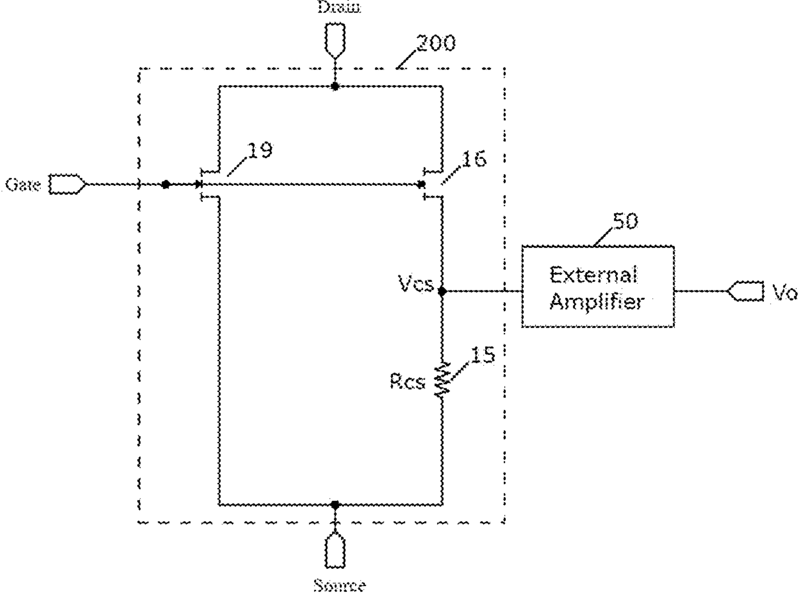
FIG. 2 depicts schematically an example current sensing circuit with an external amplifier.

FIG. 2 shows an example of a monolithically integrated GaN chip 200 comprising a main power device or first power transistor 19 and a current sensing transistor 16. In this example, the current sensing transistor 16 is identical in structure to the main power device 19, but scaled down in terms of surface area or number of fingers when compared to the main power device by a known ratio, e.g. such that the current sensing transistor 16 is 100× smaller or 1000× smaller than the main power device 19. The main power device 16 is a main high voltage HEMT and the current sensing transistor is a high voltage sense HEMT. The source of the current sensing transistor 16 is connected to a load or a current sensing resistor 15. The resistor 15 may also be monolithically integrated with the main power device 19 and the current sensing transistor 16, or could be provided externally. In this arrangement, the sensing signal $V_{CS}$ is proportional to the current through the sensing resistor 15. Under ideal conditions, the current through the sensing resistor 15 is a constant fraction of the current through the main power device 19 across the whole current range and across the entire desirable temperature range (e.g. −55 C to 150 C).

In GaN chip 200, $V_{CS}$ may be adjusted by increasing or decreasing the resistance $R_{CS}$ of the sensing resistor 15. During the linear on-state operation, the main HEMT device 19 and the HEMT sense transistor 16 can be modelled as resistors controlled by the gate voltage potential (with resistances $R_{on\text{-}main}$ and $R_{on\text{-}sense}$, respectively). For a low $V_{CS}$ (which generally provides improved linearity of the current sensing solution), the ratio between $R_{CS}$ and $R_{on\text{-}sense}$ is ideally small (e.g. less than 0.1). This is because, under this model:

$$V_{CS} = \frac{R_{CS}}{R_{CS} + R_{on-sense}} V_{ds} \tag{2}$$

where $V_{ds}$ is the voltage drop across the drain-source terminals of the current sense transistor 16. As a result, $R_{CS}$ being small when compared to $R_{on\text{-}sense}$ helps to alleviate the effect of the dynamic $R_{on}$ of the current sense transistor 16 and improve the current sensing accuracy of the device.

One solution to the trade-off between the sensitivity and linearity of the signal $V_{CS}$ is to keep $V_{CS}$ relatively low to improve linearity and accuracy of current sensing (e.g. with respect to temperature and process variations, and providing an external amplifier 50 connected to the $V_{CS}$ node to increase the sensitivity of the current sensing device, as shown in FIG. 2. In this case, the sensitivity of the current sensing is given by the ratio between the output signal $V_o$ (which is equal to the product of $V_{CS}$ and the amplification of the amplifier 50) and the current $I_{main}$, through the main power device 19. However, providing an external amplifier 50 results in a higher bill of material (BOM), and therefore increases production costs. Moreover, parasitic components (e.g. parasitic inductances, capacitances and resistances) resulting from the extra connections between the GaN chip 200 and the external chip of the amplifier 50 may affect the current sensing reading, especially at high operating frequencies. Any attempt to monolithically integrate the amplifier 50 with the power switching device 19 in GaN chip 200 is significantly complicated by the fact that the potential on the current sensing node $V_{CS}$ is very low (in most cases lower than the threshold voltage of an enhancement mode transistor), and the sensing load 15 is attached to ground level.

Figure 3:
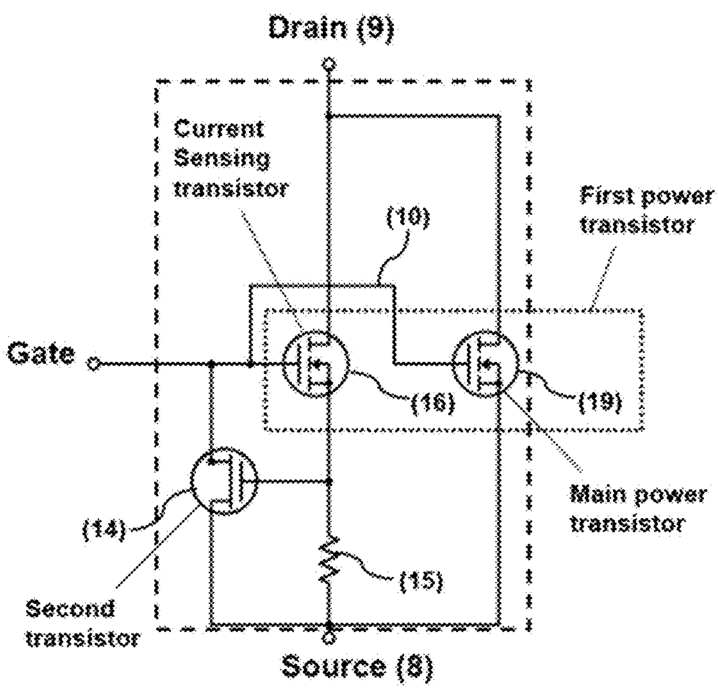
FIG. 3 depicts schematically a further example current sensing circuit.

FIG. 3 depicts a similar example current sensing device to that shown in FIG. 2. However, in FIG. 3 the current sensing transistor 16 is further connected to the gate of a second transistor 14. The second transistor 14 has its drain terminal connected to the gate 10 of the main power device 19 to provide over current protection capabilities.

Figure 4:
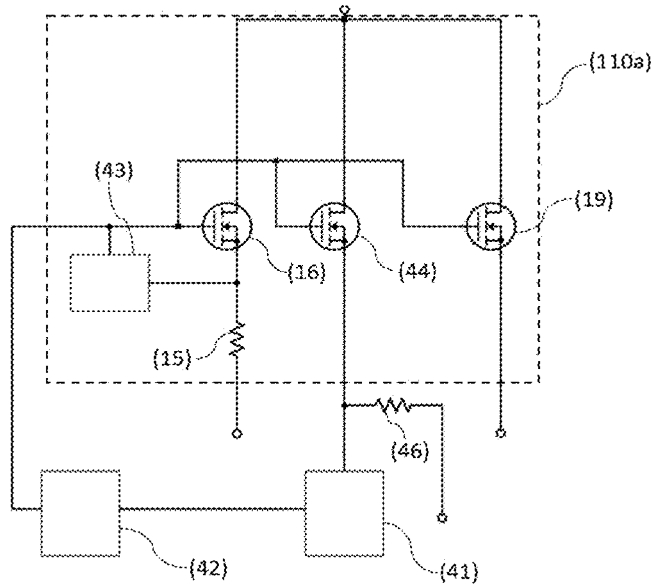
FIG. 4 depicts schematically a further example current sensing circuit.

In FIG. 4, two transistors 44 and 16 are provided for current sensing in an example GaN chip 110*a*. The first transistor 44 is used for current sensing, and its signal is amplified externally and transmitted to an external controller unit 41 while the second transistor 16 is used for internal current sensing/protection using the load resistance 15 and integrated feedback circuit 43.

Figure 5:
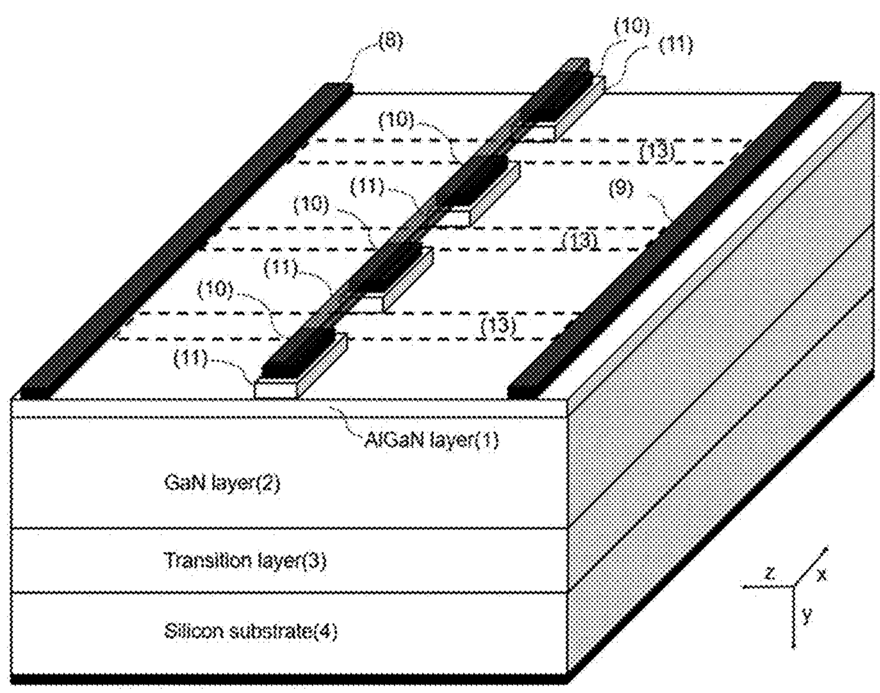
FIG. 5 depicts schematically an example transistor structure suitable for use in a current sensing circuit.

FIG. 5 shows a schematic representation of an example depletion mode HEMT using p-GaN gate technology. The p-GaN gate layer 11 is split in multiple islands connected to the gate terminal 10. The 2DEG carrier concentration at the AlGaN/GaN interface between the p+ islands 10 can be modulated based on the potential applied to the gate terminal of the device (e.g. relative to a source), and therefore the current from the drain terminal 9 to the source terminal 8 may be modulated in this manner. This device may be efficiently operated as a voltage controlled resistor in a voltage range corresponding to the source terminal potential at one end (for example, a ground) and the threshold voltage of the pGaN HEMT at the other end. Above the threshold voltage, the device is fully on and the resistance of the device drops significantly.

Other low voltage (and high voltage) devices can also be used for sensing and protection circuits, and be monolithically integrated with the main power device. For example, conventional Schottky gate devices could be used as depletion mode devices, while conventional p-GaN gate devices can be used as enhancement mode devices.

In many Schottky gate devices, the threshold voltage of the device (i.e. the gate bias voltage at which the device is considered to move from the off-state to the on-state and vice versa) is dependent on process parameters such as, but not limited to, the AlGaN layer thickness, aluminum mole fraction and gate metal stack. In the on-state, these Schottky gate devices have a limit on the maximum positive gate bias voltage which can be applied on the gate terminal before the main on-state conduction path (i.e. low resistance path) changes from drain-source to gate-source. This maximum bias voltage depends on the Schottky barrier height present at the gate contact and generally does not exceed 1.5V. In addition, depletion mode Schottky devices tend to have a limited current modulation capability when applying small positive differences between the gate terminal and the source terminal (e.g. ~0.1 V or less).

Enhancement mode devices are configured such that they are "off" when a signal provided between the gate terminal and the source terminal is below the threshold voltage. The threshold voltage is generally in excess of 1V, meaning that an enhancement mode device "off" when the signal between the gate and the source is below 1V. For example, in FIG. 3, if the second transistor 14 is an enhancement transistor with a threshold voltage is in excess of 1V, the transistor 14 cannot be used directly for current sensing or current monitoring if the voltage developed across the sensing load 15 (which is proportional to the current flowing in the current sensing transistor 16) is below 1V. Such an arrangement could be useful for over current protection, activating the second transistor 14 when the current in the main HEMT 19 exceeds a given triggering value, but cannot be used for current sensing as the transistor 14 would be off for a current below the said triggering value. In contrast, depletion mode devices are configured such that they are on when a signal provided between the gate terminal and the source terminal is close to 0V, and as a result a depletion mode transistor may be used directly for current sensing or current monitoring.

On the other hand, as mentioned above, it is often advantageous to restrict the maximum voltage across a sensing load. If this sensing voltage is too high (e.g. greater than 0.3 V), the current through the current sensing transistor may no longer scale with the current in the main transistor, compromising the linearity of the sense signal $V_{CS}$. Furthermore, and as already mentioned, the linearity and accuracy can be further compromised across the temperature range and in the presence of other factors such as Dynamic om-state resistances (specific to GaN HEMTs) and manufacturing tolerances. From the discussions above, it will therefore be understood that it is sometimes advantageous to limit the maximum voltage drop across the sensing load to be as small as possible, e.g. smaller than 0.3V, smaller than 0.2V or even smaller than 0.1V. If the sensing load and the sensing transistor are provided in series (as in FIGS. 3 and 4), the sum of the voltages across the sensing load and the sensing transistor (i.e. between the drain and source terminals of the sensing transistor) are equal or approximately equal to the voltage drop between the drain and source terminals of the main transistor. Since, during the normal on-state operation, the voltage drop across source-drain terminals of the main transistor is often less than 2V, and it is advantageous for the voltage drop across the sensing load to be on the order of 0.2V or less, it follows that the sensing load resistance may be selected to be less than 1/10 of that of the on-state resistance of the sensing load transistor. Typical values of these resistances could be in the ohm range (e.g. 1-5 ohm), however it will be understood that all of the values given above may vary significantly depending on the specific ratings and applications where the device is used.

If the sensing load is integrated monolithically, the variation of the sensing load resistance $R_{CS}$ with temperature may depend on the material and processing of the layers which are used to make it. For example, the resistor could be made of a 2DEG layer, a metal layer, a polysilicon layer or a SiCr layer. Out of the four, the SiCr layer is the most stable with respect to temperature, but the use of a SiCr layer would require significant wafer area in return for relatively small resistance values. On the other hand, both 2DEG and metal resistances vary significantly with temperature. Alternatively, the sensing load resistor could be provided externally. While this may be advantageous to provide a more accurate reading in temperature, the external connection from the current sense HEMT to the sensing load could result in a stray inductance and further parasitic R-C components, as discussed above with regard to the connection to the external amplifier of FIG. 2. Given that this resistance is desirably very small, the effect of stray inductance may not be negligible, and in some cases may significantly impact the resulting measurements.

As a result, and broadly speaking, in the current sensing devices described in this disclosure, it is advantageous, but not required, for the voltage signal across the sensing load to be small when compared to voltage drop between the source and drain terminals of the sensing transistor (and/or the sensing load resistance should otherwise be small when compared to the resistance of the sensing transistor) to improve the accuracy of the current sensing solution. To improve the sensitivity of the device, the $V_{CS}$ signal may be amplified e.g. using devices and circuits that are monolithically integrated with the power device.

Figure 6:
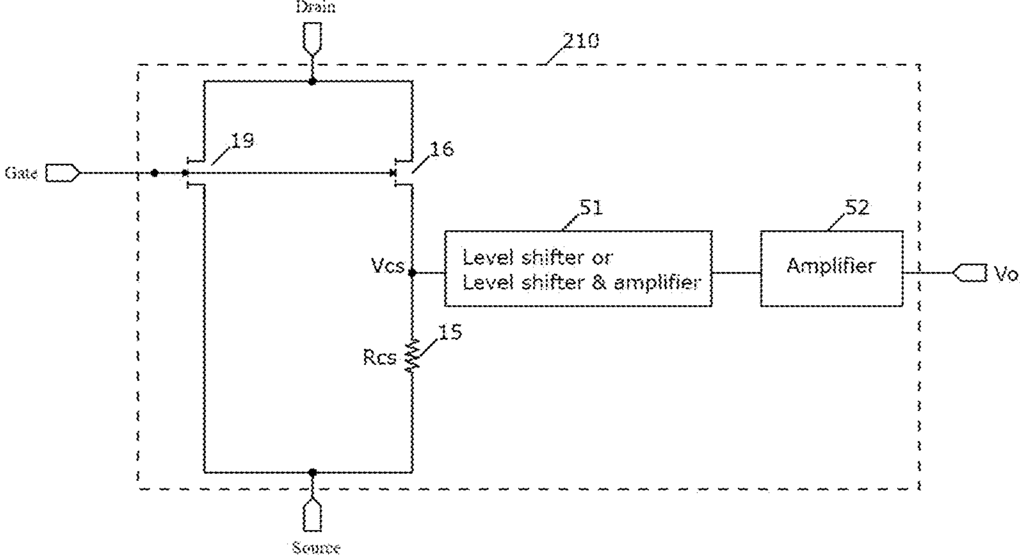
FIG. 6 depicts schematically an example current sensing circuit according to an aspect of the present disclosure.
Figure 7:
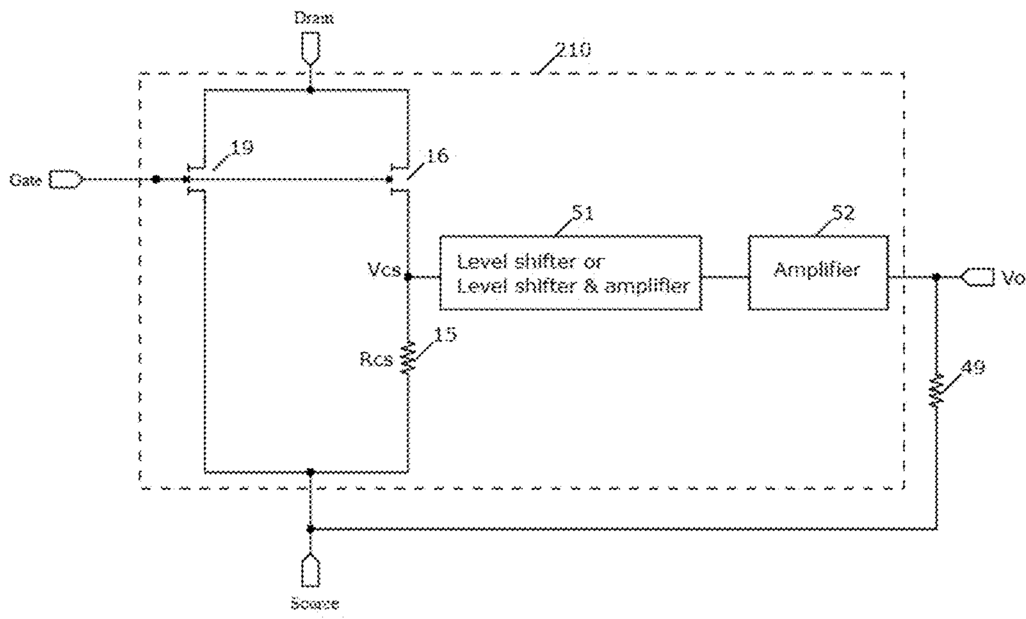
FIG. 7 depicts schematically a further example current sensing circuit according to an aspect of the present disclosure.

FIGS. 6 and 7 show and example of such a power device 210 with monolithically integrated current sensing circuitry. All of the components in device 210 are monolithically integrated, to reduce parasitic components and improve the accuracy of the current sensing solution. FIGS. 6 and 7 differ in that FIG. 7 additionally comprises an external output load resistor 49.

The power device 210 may be a heterojunction III nitride high voltage device comprising at least one layer of AlGaN adjacent to a layer of GaN, such that a two-dimensional electron gas (2DEG) is present at the interface between the AlGaN and GaN layers. Isolation areas are provided between at least some of the transistors in device 210 to reduce interference. For example, the main power device 19 may be isolated from low-power transistors in circuits 51 and 52 and the sensing load. The isolation region could be a region where the 2DEG is absent, for example by means of appropriately etching or doping the device 210. Additionally, or alternatively, shield metal layers could be provided to reduce or, ideally, remove interference between different components and/or devices resulting from e.g. the presence of fast transient signals. Such shields could be for example be formed of metal layers connected to fixed DC potentials (such as the ground).

An output load resistor can be provided externally to the power device 210 (e.g. as resistor 49 of FIG. 7) or provided integrated with the device (e.g. in the amplifier 52) to adjust the current sensing sensitivity (i.e. the gain of the amplifier). Providing the output load resistor externally, improves the power system design flexibility, as the output load resistor or resistance may be changed or otherwise altered (e.g. by an end user) based on the specific use requirements.

In some implementations, this output load resistance is stable or substantially stable with respect to temperature (i.e. it has little variation with temperature across the whole temperature range), so as to not introduce further variations in the current sensing signal $V_{CS}$ with respect to temperature. Alternatively, however, the output load resistor may be constructed or selected to provide a degree of temperature coefficient in opposition to some other temperature sensitivity of the device 210. For example, if the current sensing system 210 has a positive temperature coefficient for some attribute (such as resistance), this may be partly or fully corrected using an output load resistor with a corresponding negative temperature coefficient.

While depicted as a resistive element 15 in power device 210, the resistive sensing load 15 may instead be provided by a transistor e.g. used as a resistive element or as a current sink.

The power device 210 comprises an integrated amplifier 52, in contrast to the external amplifier 50 shown in FIG. 2. The amplifier structure 52 may be a voltage amplifier or a current amplifier. For example, a voltage amplifier may be used to amplify the $V_{CS}$ signal, while a current amplifier may be used to amplify the current through the sense transistor 16. It may also provide an output signal predominantly as a voltage or as a current. Generally speaking, it is beneficial to configure amplifier 52 to provide a gain of >1, to amplify the output signal $V_O$ relative to the sense signal $V_{CS}$. However, when providing a current output, it is in some implementations advantageous to configure the amplifier 52 to provide a gain of <1 (i.e. to attenuate the output signal relative to the sense signal) in order to reduce the power consumption of the power device 210. As a result, the amplifier 52 may in some case be configured to provide current dis-amplification (attenuation) rather than amplification.

The amplifier 52 may be any suitable amplifier. For example, the amplifier 52 may contain monolithically integrated operational amplifiers (op-amps), or voltage repeaters based on op-amps, other resistors and capacitors. The amplifier 52 may also contain components or circuits configured to provide temperature compensation, to thereby maintain a high linearity (high accuracy) for the sense signal $V_{CS}$ across the whole range of operation temperatures (e.g. −55 C to 150 C).

The voltage or current amplification may be based on a ratio-metric factor, such that the ratio of two resistances (or two voltages or currents) that have largely identical variation with temperature. Such resistances can be provided by structures such as resistors or transistors that are constructed using the same method and/or in the same process, such that their variation with temperature and manufacturing tolerance is largely cancelled out. The amplifier 52 may also contain components or circuits to compensate for offset signals or other variations that arise due to imperfections in the manufacturing process.

As in FIG. 2, in power device 210 a first current to voltage converter is provided by the sensing resistance $R_{CS}$ of sensing load resistor 15. Subsequently the voltage signal may be level shifted by level shifter 51 and amplified by amplifier 52, as discussed above. After this, a voltage to current converter may be provided such that an output current is provided to the output node. The output current can be finally converted into an output voltage $V_O$ through an output load resistor (such as resistor 49). The inclusion of level shifter 51 facilitates the integration of the amplifier 52 in a manner that is not possible in GaN chip 200 of FIG. 2.

The level shifter 51 can comprise one or several low voltage diodes in series, or one or several enhancement-more transistors connected in a diode configuration in series. The diodes may be e.g. low-voltage HEMT transistors with their gate terminals short-circuited to their source or drain terminals. Alternatively, the diodes could be Schottky type diodes, or any other suitable diode.

Figure 8:
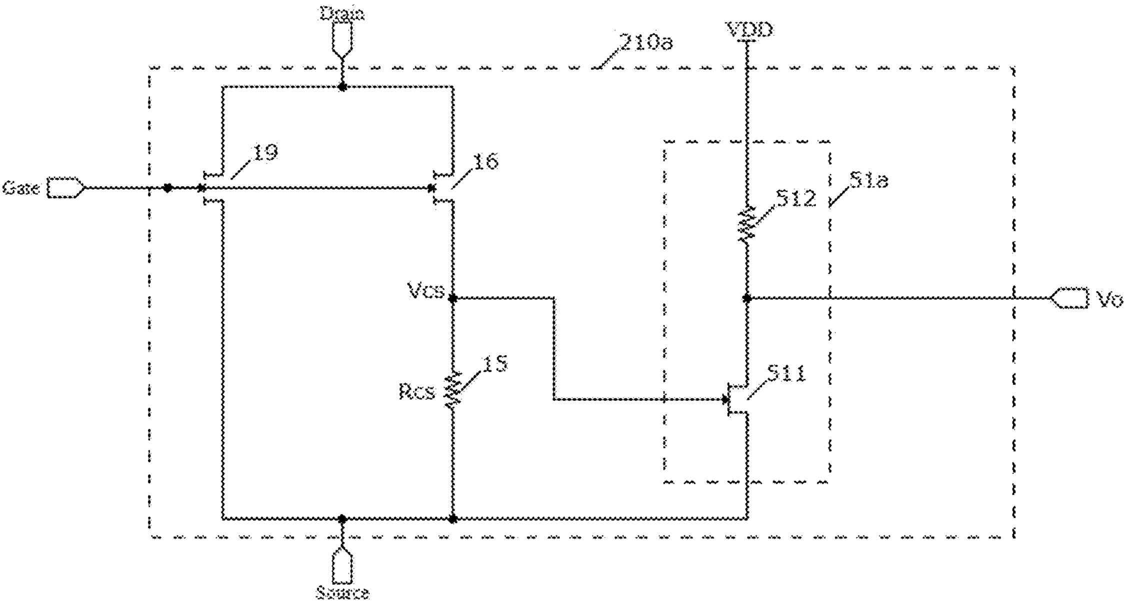
FIG. 8 depicts schematically an example level shifting circuit.

The level shifter 51 may be configured perform both a level shifting function and an amplification function, and may therefore comprise the one or several low voltage depletion mode transistors to facilitate this initial amplification. FIG. 8 shows an example of one such level shifter 51*a* monolithically integrated into the power device 210. In the example of FIG. 8, the level shifter 51 and amplifier 52 are be combined into a single monolithically integrated level shifting circuit block 51*a* which provides the output voltage $V_O$, however the level shifter 51*a* may instead provide its output to a separate (also monolithically integrated) amplifier 52, such that the level shifter 51*a* provides an initial or first amplification stage, with amplifier 52 providing a main or second amplification stage.

The level shifter 51*a* comprises a low voltage depletion mode transistor 511 configured for use as both a level shifter and an amplifier. The gate terminal of transistor 511 is connected to the source terminal of the sensing transistor 16 (and connected to a terminal of the resistive sensing load 15). More generally, if the level shifter 51*a* comprises multiple low voltage depletion mode transistors, at least one of these depletion mode transistor may have its gate terminal connected to the source terminal of the sensing transistor 16. The drain terminal of the low voltage depletion mode transistor 511 sits at higher potential than the voltage drop across the sensing load 15, and its level is modulated by the voltage signal across the sensing load 15.

The level shifter 51*a* also comprises a resistive element 512. The resistor 512 may be any suitable resistive element, for example it could be constructed from a 2DEG, or it could be a resistive element made of a second depletion mode transistor. The VDD is provided a DC voltage source. This source may be the same voltage source used to power up a controller for the device 210*a*. The VDD may be regulated by an on-chip voltage regulator, or other suitable means.

Figure 9:
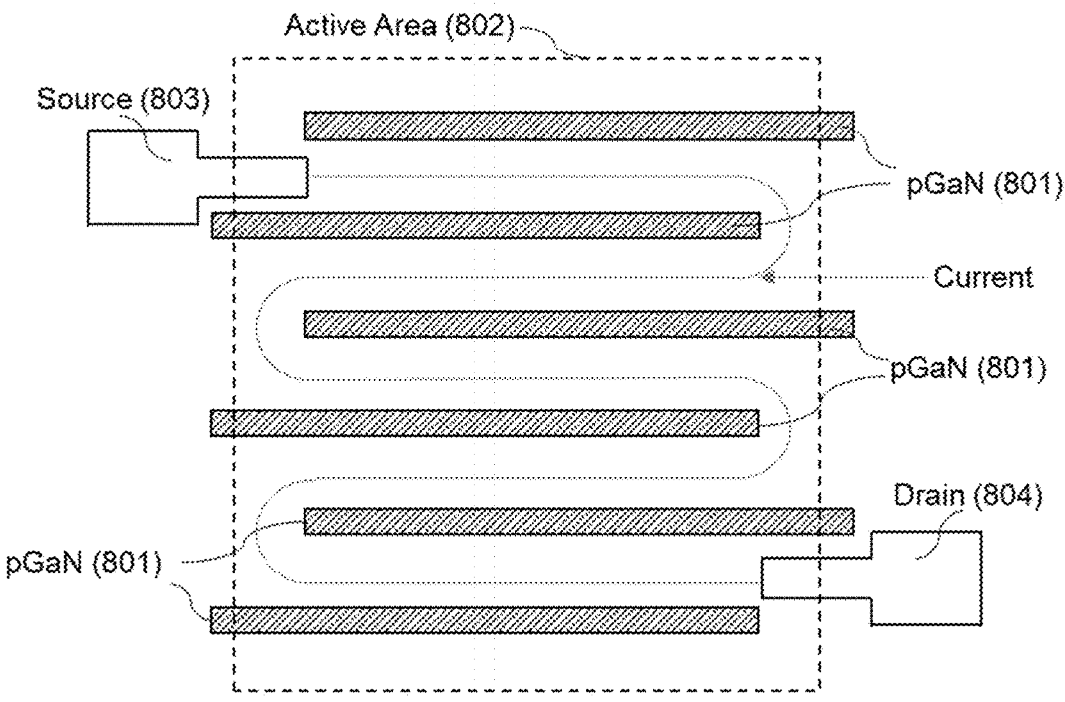
FIG. 9 depicts schematically an example transistor structure suitable for use in a level shifting circuit.

The low voltage depletion mode transistor(s) 511 of level shifter 51*a* may be any suitable transistor, for example a Schottky gate transistor or a multiple p+ GaN island transistor as depicted in e.g. FIG. 5. Alternatively, the low voltage depletion mode transistor 511 may be a transistor as shown in FIG. 9, comprising a series of p+ stripes 801 between the drain 804 and source 803. Each of the p+ stripes 801 may be connected to a single gate terminal formed by a gate metal in contact with the p+ stripes 801. The gate metal contacts of individual p+ stripes may be connected to each other using the gate metal itself as a track metal, or by using a track metal in a different layer of the device. When the gate metal is used as a track metal between p+ stripes it may be separated from the surface (e.g. an AlGaN layer) of the semiconductor layers by a surface passivation layer or a dielectric layer.

The p+ stripes 801 are configured to have a relatively narrow pitch between them, with two or more p+ stripes 801 used in the design of a low voltage depletion mode transistor. In one example configuration, the gap or pitch between the p+ stripes 801 is 400 nm or less. A 2DEG is formed at an AlGaN (surface) layer/GaN (sub-surface) layer interface, in the narrow region formed between the p+ stripes 801. The edges of the active area 802 are shown in FIG. 9. Upon an application of a gate potential, with respect to the source potential, a lateral depletion modulates the 2DEG formed between the p+ stripes 801. The potential applied to the gate terminal of the low voltage depletion mode transistor may be the same as the potential at the terminal of the current sensing load 15.

A transistor designed according to FIG. 9 may provide a higher transconductance, especially if the pitch between adjacent p+ stripes is small. The higher transconductance advantageously provides an improved amplification of the voltage signal across the sensing load resistance 15.

Figure 10:
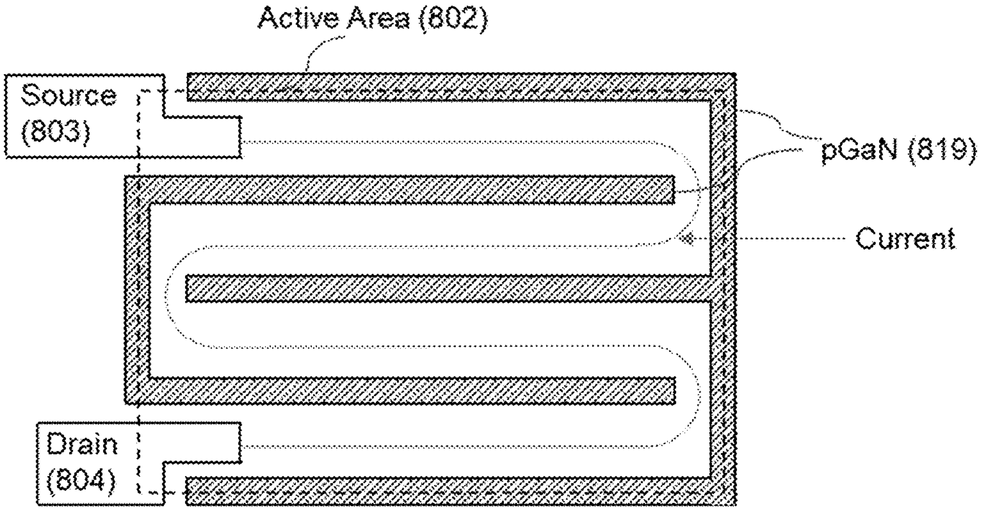
FIG. 10 depicts schematically a further example transistor structure suitable for use in a level shifting circuit.

An alternative arrangement for the low voltage depletion mode transistor(s) 511 of level shifter 51*a* is shown in FIG. 10. This arrangement is similar to that shown in FIG. 9, however in this arrangement alternating p+ stripes are joined together to form two p+ regions 819 surrounding the active area 802 of the transistor.

Figure 11:
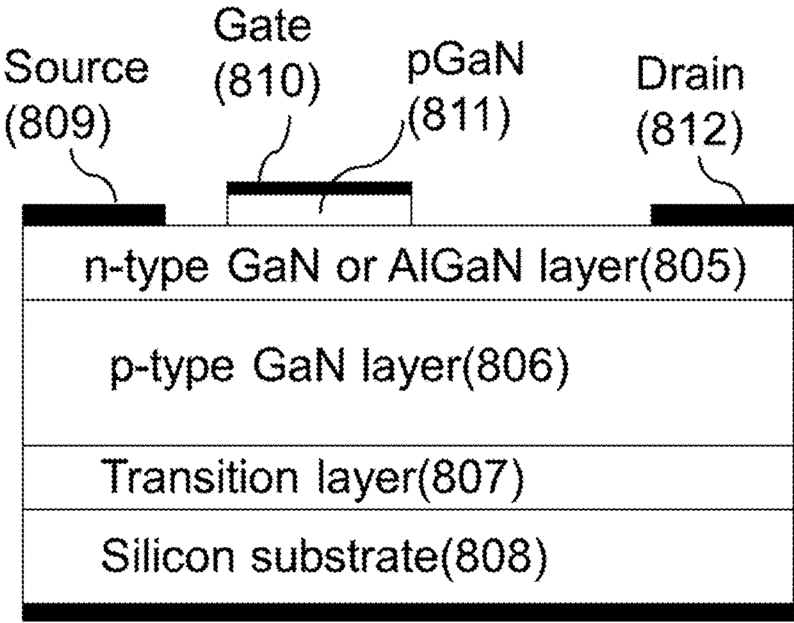
FIG. 11 depicts schematically an example Junction Field Effect Transistor (JFET) structure suitable for use in a level shifting circuit.
Figure 12:
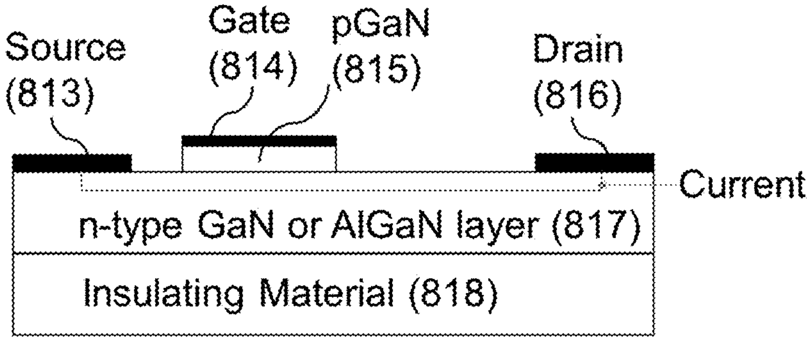
FIG. 12 depicts schematically a further example JFET structure suitable for use in a level shifting circuit.

The low voltage depletion mode transistor(s) 511 may be a Junction Field Effect Transistor (JFET). FIGS. 11 and 12 show example cross sections of suitable JFETs. The conduction (or surface) layer of the example JFETs comprises an n-type GaN or AlGaN 805, 817 or other 2DEG layer, and is provided between source terminal 809, 813 and the drain terminal 812, 816. p+ GaN or AlGAN layers 811, 815 are connected to a gate terminal 810. The pGaN structure 811, 815 forms a junction with the conduction layer 805, 817. The depletion region associated with this junction (formed between the p+ GaN structures 811, 815 and the conduction layer 805, 817) modulates the current flowing between the drain 812, 816 and the source 809, 813 terminals through the conduction layer 805, 817. The potential applied to the gate terminal of the JFET may be the same as the potential at the terminal of the current sensing load 15. The use of such a JFET as the low voltage depletion transistor 511 may advantageously provide a relatively high transconductance when the gate voltage $V_{gs}$ is equal to or close to 0V, and a relatively small leakage through the gate terminal when $V_{gs}$ is forward biased.

In the power device 210*a* of FIG. 8, the current through the sense transistor or sense HEMT 16 is indicative of the current through the main transistor or main HEMT 19, as the sense current through transistor 16 is a known and (ideally) constant fraction of the main current through transistor 19. The voltage drop across the sensing load 15 is proportional to the current through the sense HEMT 16, and is also the same as the gate-source potential of the depletion mode transistor 511. This voltage drop value therefore modulates the current through the main terminals of the depletion mode transistor 511 and hence the voltage drop across the main terminals of the depletion mode transistor 511. As an example, if the voltage drop across the sensing load 15 is between 0 and 0.3V when the main HEMT 19 conducts current between its drain and source terminals, the voltage drop across the drain-source terminals of the depletion mode transistor 511 is shifted above 1V (for example to 3V) and possibly amplified (for example to between 3 and 3.6V). It will be understood that in this example, the amplification would also invert the signal such that when $V_{cs}$ is high, $V_o$ is low and vice versa. In this example, VDD may be between 5V and 20V, and in any case must be in excess of the maximum desired output voltage, $V_o$. The resistance 512 may be set or otherwise selected to provide a favourable bias point across the depletion mode transistor 511.

One or more additional amplification stages may be used with this circuit. A second (or third, if the level shifter also provides an initial amplification stage) amplification stage may comprise an enhancement mode transistor and a resistor, or may be any other suitable amplifier.

Figure 13:
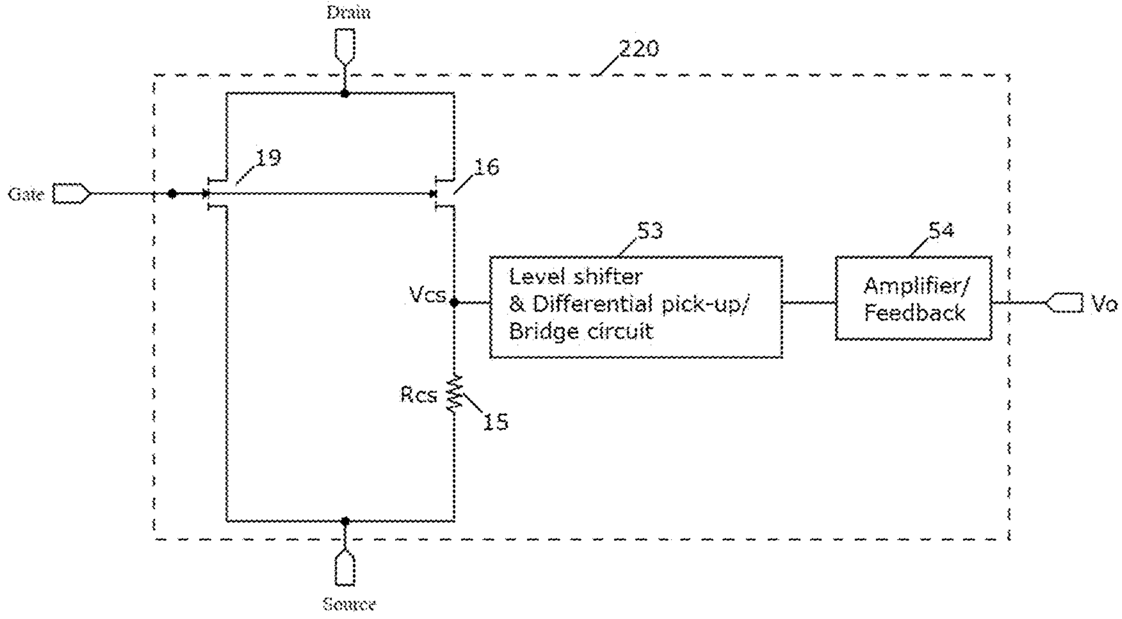
FIG. 13 depicts schematically an example current sensing circuit comprising a bridge circuit according to an aspect of the present disclosure.

FIG. 13 shows a further example power device 220. The power device is similar to power device 210, and like reference numerals are used. However, in power device 220, level shifter 51 is replaced by a level shifter and differential bridge circuit 53, while amplifier 52 is replaced by an amplifier and feedback circuit 54.

A bridge circuit (such as Whetstone bridge) may be used for measuring unknown resistances or changes in resistances, a bridge circuit generally comprises a two leg (or two arm) structure, each leg featuring a lower part and an upper part separated by a mid-point. Upper parts of each leg is connected to a common node, which is further connected to a low-voltage DC rail (VDD). The lower parts of each leg are similarly connected to a common node and in turn to a lower DC level than VDD (e.g. ground level). An active leg as defined herein is a leg which either comprises a sensing resistive load or a component which is controlled by the voltage across the sensing resistive load (which in turn is controlled by the current through the main power device).

A bridge circuit is said to be balanced when the mid-points on the two legs are at the same potential. When, for example, one variable is changed in one of the upper or lower parts of the active leg, the bridge is or becomes unbalanced. The change in the variable can therefore be measured by the voltage drop across the mid-points of the legs, which may be in turn amplified to further improve the sensitivity of the bridge circuit.

Figure 14:
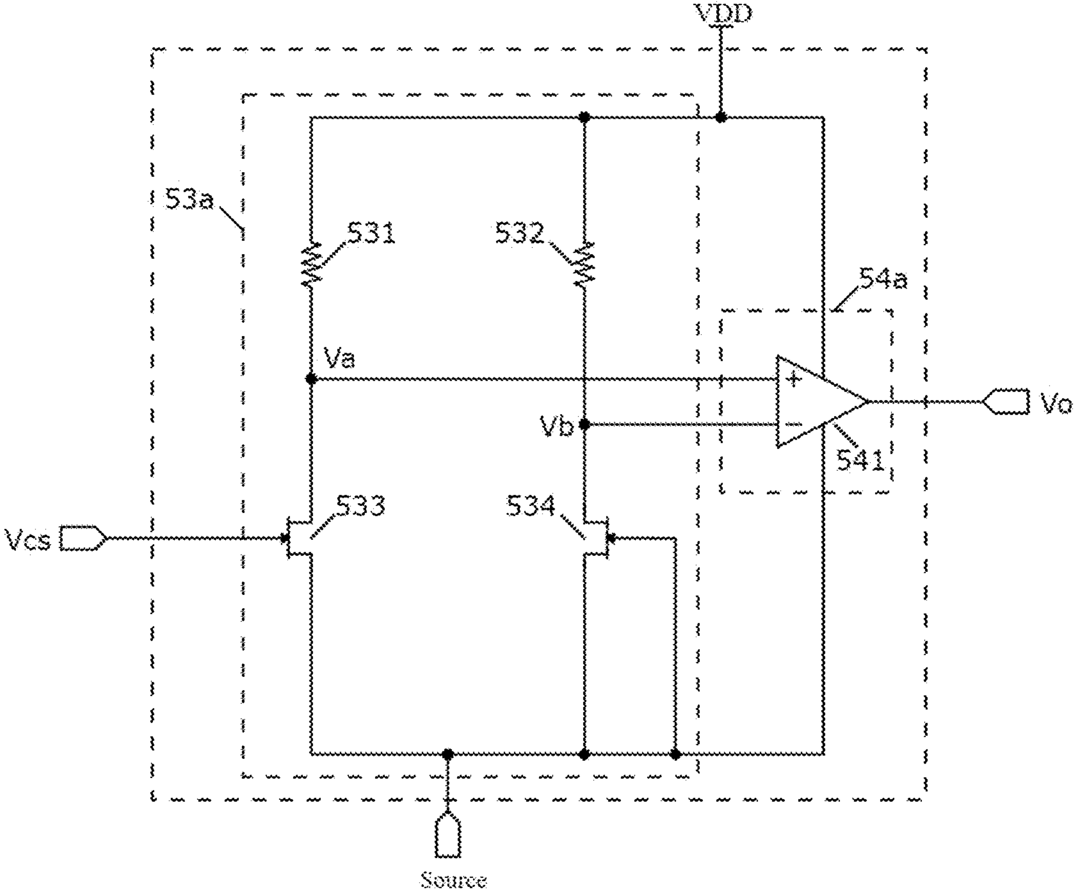
FIG. 14 depicts schematically an example bridge circuit and amplifier for use in a current sensing device.

FIG. 14 illustrates an example of a level shifter and differential bridge circuit 53*a* and an amplifier 54*a*. Amplifier 54*a* comprises an operational amplifier 541, which amplifies the signal difference between the "+" and the "−" inputs.

The upper parts of the first and second legs of bridge circuit 53*a* comprise resistors 531, 532. These resistances may instead be provided by transistors used as resistors or current sources with components matched in geometry and performance (or ratio-metrically matched). Such components may also be placed side by side. The bottom part of the first leg of the differential bridge circuit 53*a* comprises a low voltage depletion mode transistor 533 configured for use as a level shifter and amplifier, in a similar manner to the depletion mode transistor 511 described above with reference to FIG. 8. The current sensing voltage signal $V_{cs}$ is connected to the gate terminal of the depletion mode transistor 533. This first level shifter structure may level shift the signal $V_{cs}$ across the resistive sensing load 15 to a level higher by at least the threshold voltage of an enhancement heterojunction transistor (i.e. higher than 1V), based on the sizing of the depletion mode transistor 533 and the resistor 531 connected in series on this leg.

The bottom part of the second leg of the differential bridge circuit 53*a* may also comprise a (second) depletion mode transistor 534 configured for use as a level shifter. The second level shifter structure may act as a reference to the amplifier 54*a*. The second depletion mode transistor 534 shown in FIG. 14 is source-gate connected. The depletion mode transistor 534 in the second level shifter structure may be matched (e.g. in geometry and performance, or ratio-metrically) and placed side-by-side to the depletion mode transistor 533 in the first level shifting structure. By placing the transistors 533 and 534 side-by-side with matching structures, any process related variations may be minimised due to the proximity of the two transistors. Matched in this instance may refer to the two structures having identical layout designs and/or using other techniques known in the prior art. Good matching of the two devices 533, 534 may reduce any offset signal at the input of the amplifier 54*a* and therefore improve the current sensing performance of the circuit. In the same manner, the two resistances 531, 532 in upper parts of the two legs of the differential bridge circuit 53*a* may also be matched in terms of layout and placed in close proximity, as described above.

The first level shifted signal $V_a$ and the level shifted signal reference $V_b$ are applied as signals to the differential amplifier 54*a*. The gain of the amplifier 54*a* may be designed based on the usage requirements. For example, the amplifier may have a fixed gain of 10. Designing the differential amplifier with a gain that is too high may lead to a limited signal operating range, as the output signal may become saturated by the amplification, and/or signal linearity may be reduced.

Figure 15:
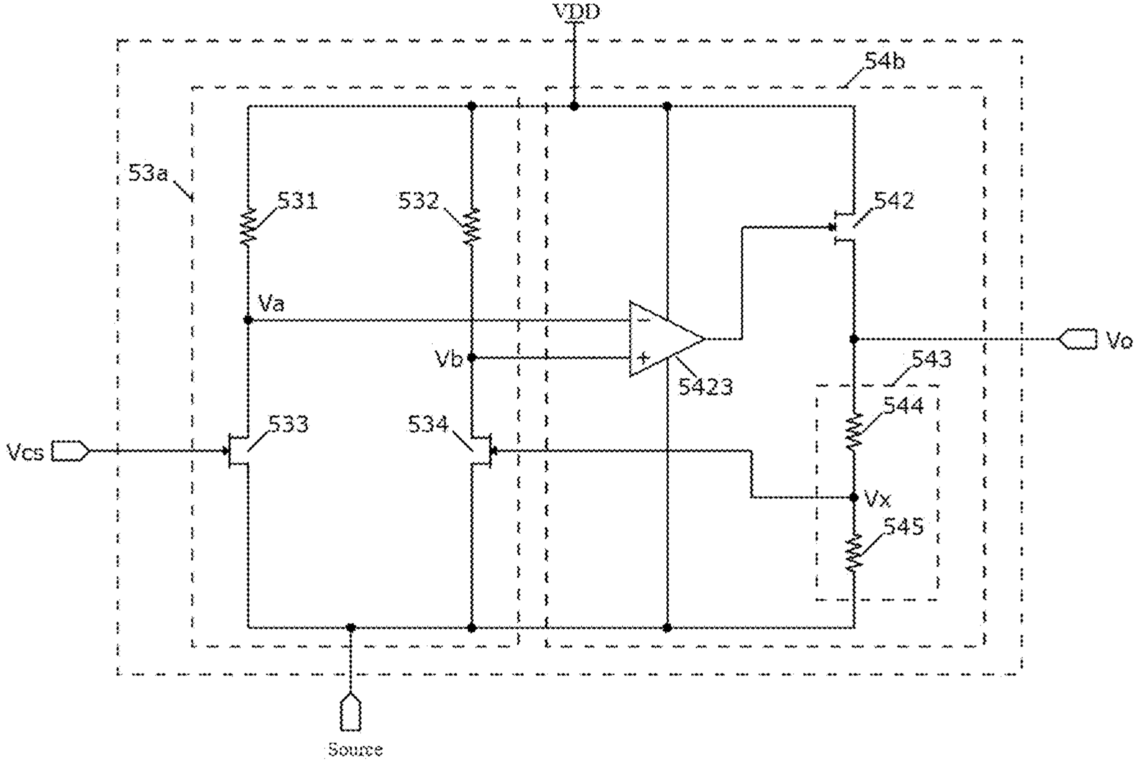
FIG. 15 depicts schematically a further example bridge circuit and amplifier for use in a current sensing device.

FIG. 15 shows an additional example of a level shifter and differential bridge circuit 53*a* in combination with an amplifier 54*b*. Level shifter 53*a* is structurally unchanged from the level shifter 53*a* shown in FIG. 14, and comments the comments above regarding this level shifter configuration are equally applicable here. Amplifier 54*b* in contrast, comprises both operational amplifier 5423 (which amplifies the signal difference between the "+" ($V_a$) and the "−" ($V_b$) inputs, as in FIG. 14) and a negative feedback system. Providing feedback facilitates the adjustment of the fixed gain of the amplifier 54*b*, e.g. through adjusting the resistance value ratio of resistors 544 and 545 used in the feedback circuit. One or both of the resistors 544 and 545 may be provided externally (i.e. not monolithically integrated with the rest of the power device 220) such that the gain of the amplifier 54*b* may be adjustable off-chip.

The feedback circuit of amplifier 54*b* comprises an enhancement mode transistor 542 with its gate connected to the output of the operational amplifier 5423, as wells as a resistive potential divider 543 connected in series with the enhancement mode transistor 542. The ratio of the resistors 544 and 545 in the potential divider may be set to control the fixed gain of the amplifier 54*b*, as described above. The midpoint of the potential divider is connected as feedback signal $V_x$ to the gate of the second depletion mode transistor 534, which in turn sets the level shifted signal reference $V_b$.

In this configuration, the bridge circuit 53*a* operates largely in an auto-zero mode. This means that the bridge is balanced. If all components within the 4 parts of the bridge are virtually identical, or ratio-metrically matched (through one leg being a scaled copy of the other), the gate terminals of the first and the second depletion mode transistors 533, 534 must be at the same potential, $V_{CS}$, for the bridge to remain balanced. This is possible if:

$$V_o = \frac{R_1 + R_2}{R_2 V_{CS}} \tag{3}$$

where $V_o$ is the output voltage on the current sensing node, and $R_1$ and $R_2$ are the resistances of resistors 544 and 545 within the potential divider 543, respectively. If the ratio of $R_1$ and $R_2$ is significantly greater than 1 (e.g. R1/R2>10), then the output voltage on the current sensing node can be approximated as:

$$V_o \approx \frac{R_1}{R_2} V_{CS} \tag{4}$$

The operational amplifier 5423 assists in maintaining the potentials of its "+" and "−" inputs virtually or approximately the same. If resistors 544 and 545 are placed in close proximity, their resistances $R_1$ and $R_2$ are well matched (e.g. due to relatively small differences in process variation). Moreover, resistors 544 and 545 may be selected to have a similar temperature dependence. This reduces, or in some cases may significantly reduce, the temperature variation of the amplification provided by amplifier 54*b*, and thereby improve the accuracy of the current sensing solution with respect to temperature.

Each of the operational amplifiers 541, 5423 discussed above may be used for amplification or as repeaters (i.e.

voltage buffers with amplification close to unity). For example, amplifier 54 may contain two op-amps in a repeater configuration, wherein each of the op-amps has an input connection to each of the midpoints of the bridge circuit. One example configuration utilising this approach is shown in FIG. 16.

Figure 16:
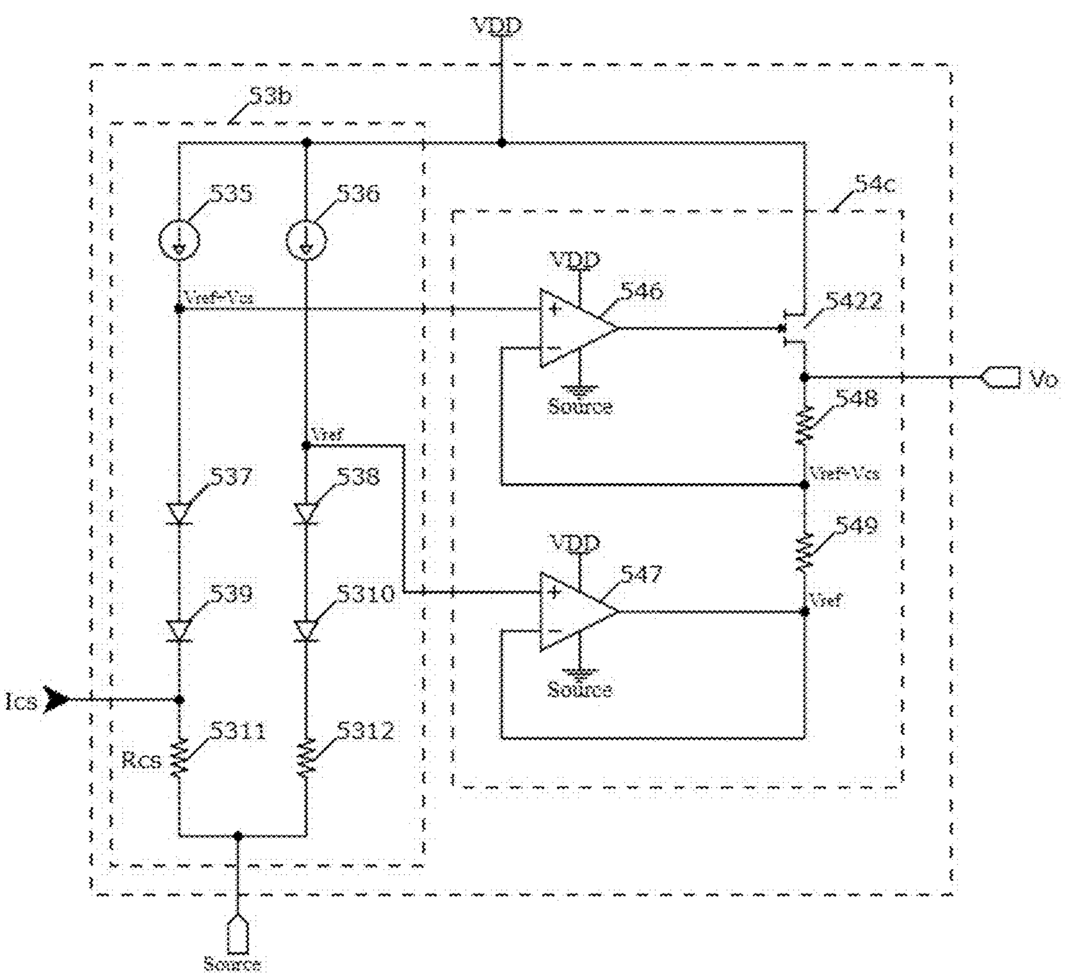
FIG. 16 depicts schematically a further example bridge circuit and amplifier for use in a current sensing device.

FIG. 16 shows a further example of a level shifter and differential bridge circuit 53*b* and an amplifier 54*c*. In this configuration, the first leg of the differential bridge circuit 53*b* comprises a resistor 5311, a current source 535 and two diodes 537 and 539. The current sensing signal $I_{cs}$ is connected to the first leg between the cathode terminal of the diode 539 and the resistor 5311. Resistor 5311 may be the resistor as the sensing load resistor 15 in power device 220, or may be a separate resistor provided in parallel to the sensing resistive load 15. Where the resistor 5311 is also the sensing resistive load 15, the sensing signal $V_{cs}$ in this example may be defined as:

$$V_{CS}=I_{CS}*R_{CS} \quad (5)$$

where $R_{cs}$ is the resistance of resistor 5311. Resistors 5311 and 5312 of the first and second legs of bridge circuit 53*b* may be placed in close proximity for good matching. These resistors may be formed of a 2DEG, metal or other layers (e.g. SiCr).

In this configuration, as the bridge circuit 53*b* contains the current sensing load 5311/15 (in the lower part of the active or first leg of the bridge circuit), there is no need for depletion mode transistors to be provided in the lower parts of the bridge legs, thereby facilitating the use of level shifting diodes and/or current sources in the bridge legs. Advantageously, this configuration may be simpler to implement than previously described implementations of the bridge circuit and amplifier.

In addition to current sources 535 and 536, the upper parts of the first and second legs may comprise resistors and/or transistors used as resistors or current sources with components matched (or ratio-metrically matched) in geometry and performance, and optionally positioned side by side.

The level shifter structure comprises one or more diodes 537, 538, 539, 5310. The diodes 537, 538, 539, 5310 provide a level shifting function, and the number of diodes may be adjusted according to the level of level shifting required. Different diodes or diode-like structures, including for example Schottky diodes and/or a series of source-gate (or drain-gate) connected transistors may be used be to implement this level shifting structure. In alternative examples, resistors and threshold multiplier arrangements may be used.

$V_{ref}$ may be defined as the voltage drop across the level shifting diodes (537 and 539 in first leg, 538 and 5310 in second leg) and the resistors (5311 in first leg, 5312 in second leg) due to the biasing current from the current sources (535 in first leg, 536 in second leg). The level shifted current sensing signal $V_{ref}+V_{cs}$ is connected to the "+" input of the first operational amplifier 546. The second leg of the differential bridge circuit comprises identical components to the first leg. These components are matched (or ratio-metrically matched), as closely as possible, to the first leg according to the matching methods described above. The second leg of the differential bridge circuit provides the reference signal $V_{ref}$ as the "+" input to the second operational amplifier 547.

The second operational amplifier 547 is connected in a buffer configuration, with its output connected as feedback to the inverting ("−") input (also called the negative terminal). The output of the second operational amplifier 547 is therefore equivalent to the reference signal, $V_{ref}$. The output of the first operational amplifier 546 is connected to an enhancement mode transistor 5422, which is connected in series with a resistive potential divider 548, 549. The mid-point of the potential divider provides feedback to the inverting ("−") input of the first operational amplifier 546, and therefore the negative node of the first operational amplifier 546 has an equivalent potential to the level shifted current sensing signal $V_{ref}+V_{cs}$.

As a result, by adjusting the ratio of the resistances 548, 549 of the potential divider, the gain of the amplifier arrangement 54*c* may be selected, with the output voltage $V_o$ again given by the equation (3) above, where $R_1$ and $R_2$ are the resistances of resistors 548 and 549 of the potential divider, respectively. As a result, if the ratio of $R_1$ and $R_2$ is significantly greater than 1 (e.g. R1/R2>10), then once again the output voltage on the current sensing node can be approximated as shown in equation (4).

One or both of the resistors 548, 549 may be provided externally, such that the gain of the amplifier 54*c* may be adjustable off-chip.

The transistor 5422 may be configured to have its drain terminal connected to the rail voltage (VDD), the source terminal connected to the output sensing node, and its gate terminal connected to the output terminal of one of the operational amplifiers (e.g. amplifier 546, as shown).

In another configuration (not shown), a depletion mode transistor may be provided in place of enhancement mode transistor 5422. In this case, the output $V_o$ may be equal to $V_{ref}$ when $I_{cs}$ is zero. This may be advantageous for some uses, for example in cases in which providing a 0V output voltage when $I_{cs}$ is zero is desirable. An offset cancellation circuit (such as the offset cancellation circuit described below) may therefore be additionally provided in this configuration, to reduce the voltage output from $V_{ref}$ to 0V when $I_{cs}$ is zero.

Figure 17:
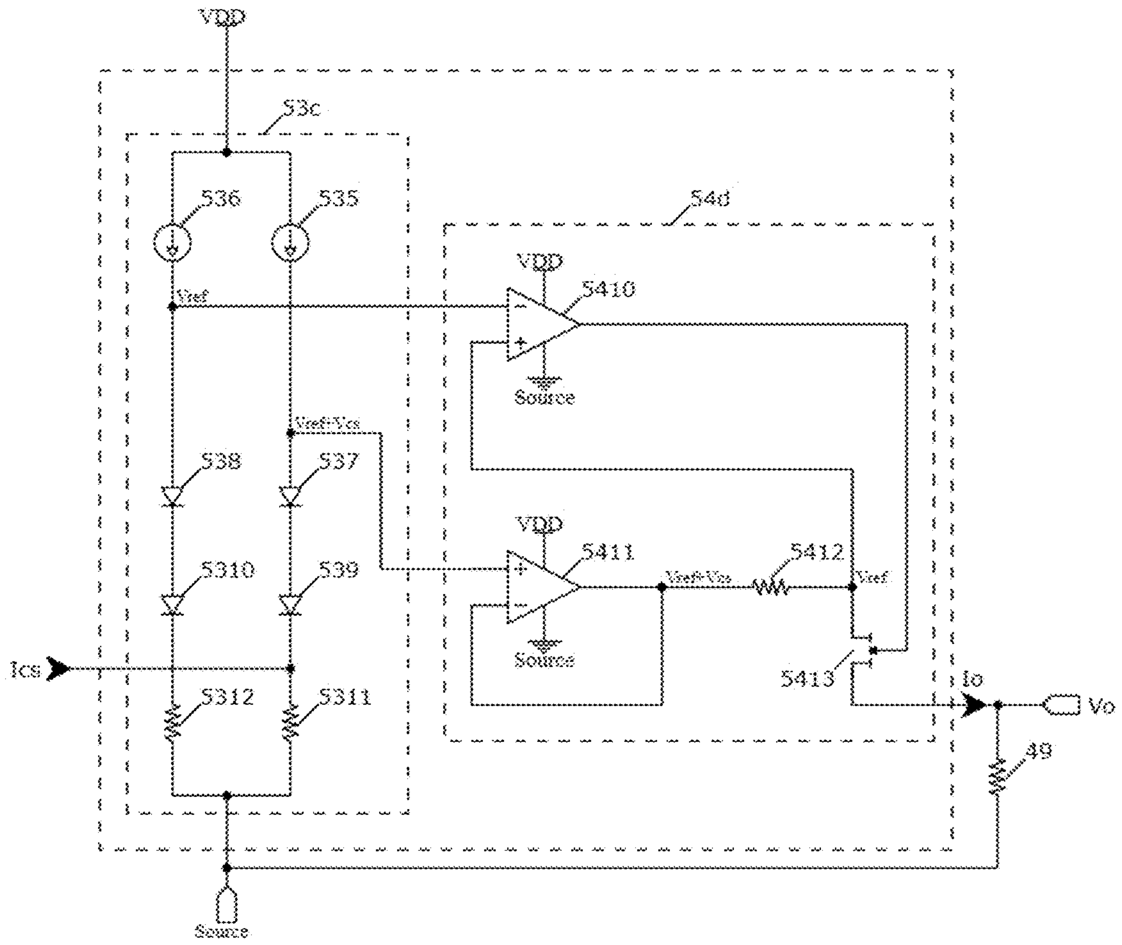
FIG. 17 depicts schematically a further example bridge circuit and amplifier for use in a current sensing device.

FIG. 17 shows an additional example of a level shifter and differential bridge circuit 53*c* and an amplifier 54*d*. In this configuration, the design of bridge circuit 53*c* is identical to that of bridge circuit 53*b* described above, with the first leg of the differential bridge circuit comprising a resistor 5311, which also acts as the sensing load resistor 15 of FIG. 13, and the current sensing signal $I_{cs}$ connected between the cathode of the diode 539 and the resistor 5311. The level shifting functionality of bridge circuit 53*c* is identical to that of bridge circuit 53*b*, and variations described in earlier examples of structures/circuits which can provide level shifting may be used. The second leg of bridge circuit 53*c* is also identical to that described above for bridge circuit 53*b*.

The level shifted current sensing signal $V_{ref}+V_{cs}$ provided from the first leg is connected to the ("+") input of the first operational amplifier 5411 of amplifier 54*d*. The first operational amplifier 5411 is connected in a buffer configuration with the output connected as feedback to the inverting input (or negative terminal). The output of the first amplifier 5411 is therefore equivalent to the level shifted current sensing signal $V_{ref}+V_{cs}$.

In contrast to bridge circuit 53*b*, the second leg of the differential bridge circuit 54*c* provides a reference signal $V_{ref}$ to the negative terminal (the inverting or "−" input) of the second operational amplifier 5410. The output of the second operational amplifier 5410 is connected to the gate terminal of an enhancement mode HEMT 5413. Alternatively, a depletion mode HEMT may be used in place of enhancement mode HEMT 5413. The drain of the enhancement mode HEMT 5413 is connected as feedback to the non-inverting "+" input (or positive terminal) of the second operational amplifier 5410. This connection sets the potential at the non-inverting input of the second amplifier 5410 as $V_{ref}$.

As a result of this configuration, the sensing signal $V_{cs}$ is established across the resistor 5412 connected to the output of the first amplifier 5411. The current output at the output node of the amplifier circuit 54*d* may therefore be set through the choice of resistor 5412. The output potential $V_o$, in relation to $I_{cs}$ (and by extension the sensing signal $V_{cs}$), may therefore be set through the choice of an externally connected resistor 49. Advantageously, this allows for the overall amplifier circuit to have an adjustable and controllable voltage gain through the choice of the externally connected component 49, such as an external component connected to an external pad terminal. The externally connected resistor 49 may be selected to have a low or very low temperature coefficient of resistance (TCR) variation, such that $V_o$ has a very weak temperature dependence and/or is substantially constant with respect to temperature across the desired voltage output range.

Thus, the amplifier circuit 54*d* may allow for current amplification (or attenuation if the amplification is desired to be less than 1). The output of the amplifier circuit 54*d* may therefore be a current signal $I_O$ which is equal to the current $I_{cs}$ that flows in the sense transistor 16*a* combined with a multiplication factor (for an amplification) or a fraction (for an attenuation). Attenuation (amplification by a factor of less than 1) of the current sense signal $V_{CS}$ in this configuration may be desirable in some cases in order to provide a low power dissipation of the current amplifier circuit 54*d*. The output of the amplifier circuit may be made available externally or may be used for functions internally (on-chip) 54*d*. It will be understood that the conversion of the output current signal $I_o$ to a voltage signal $V_O$ through the use of external resistor 49 is optional, and in some cases a current output $I_O$ may be preferred.

The choice of resistors 5311 and 5412 sets the ratio between the input $I_{cs}$ current and the output current, such that this circuit configuration provides current (rather than voltage) amplification and/or attenuation. It is generally desirable to maintain a constant (as far as possible) ratio of these resistors across temperature and across process variations. Therefore, the matching principles outlined above may be adhered to in the design of the resistors 5311 and 5412.

The current amplification circuit 54*d* may also be implemented using other initial level shifting circuits, in accordance with the block circuit illustration in FIG. 13.

It will be understood that in any of the bridge circuits described above, the lower part of the first (active) leg of the bridge may comprise any one or more, or a series of any, of the following components: diodes, transistors connected in a diode configuration, resistors, and/or depletion mode transistors, and at least one of these components may either be the sensing resistive load or may otherwise be controlled through the voltage drop across the sensing resistive load, while the lower part of the second (reference) leg may comprise matched or ratiometrically matched components to those corresponding components in the lower part of the first leg.

Similarly, in any of the bridge circuits described above, the upper part of the first (active) leg of the bridge may comprise any one or more, or a series of any, of the following components: resistors, depletion mode transistors connected in a resistive configuration and/or current sources, and the upper part of the second (reference) leg may comprise identical, matched or ratiometrically matched components to those corresponding components in the upper part of the first leg.

Figure 18:
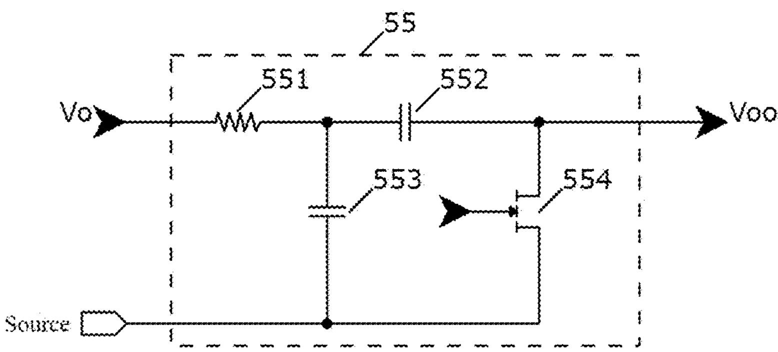
FIG. 18 depicts schematically an example offset cancellation circuit for use with a current sensing circuit.

FIG. 18 shows an example offset cancellation circuit 55 which may be connected to the output of any of the amplifier circuits described above. An issue which may harm the performance of the monolithically integrated amplifier circuits above is an offset in the output voltage signal. In other words, a non-zero output current/voltage when the input current $I_{cs}$ or input sensing signal $V_{CS}$ is zero. This offset signal may occur e.g. due to the use of non-ideal amplifiers or current/voltage sources. In some cases, this offset voltage may be considerable, due to an existing lack of reliable and widely available p-channel devices in III-nitride process design kits, which makes the design of low offset operational amplifiers more challenging than corresponding silicon based amplifiers.

To mitigate such an offset, an (offset) cancellation circuit such as circuit 55 may be included in the device, e.g. as an additional circuit block connected to the output of the amplifier circuit. This offset cancellation circuit may be monolithically integrated or provided externally (either co-packaged with the power switch device or at PCB level). Alternatively, combinations of these can be used, where some components are provided in different ways. For example, the offset cancellation circuit may comprise enhancement mode transistors which may be monolithically integrated, and resistors and capacitors which may be placed externally or co-packaged.

The offset cancellation circuit 55 shown in FIG. 18 comprises a resistor 551, capacitors 552 and 553, and an enhancement mode transistor 554. The gate of the enhancement mode transistor 554 receives an inverted control signal, such that when the input potential at the gate of the main power transistor 19 is high, the input potential at the gate of the enhancement mode transistor 554 is low (and vice versa). Therefore, in operation, the enhancement mode transistor 554 is on when the main power transistor 19 and current sense transistor 16 are off. As no current is flowing through the power and sense transistors 19 and 16, the output signal Vo of the amplifier is equal to $V_{offset}$. $V_{offset}$ is, therefore, stored in capacitor 552 during this period. In the next interval when the main power transistor 19 and current sense transistor 16 turn on, the enhancement mode transistor 554 is turned off, such that the stored $V_{offset}$ signal is connected in series between $V_o$ and the output of the amplifier circuit. As a result, the output of the cancellation circuit is the corrected output signal $V_{OO}$, where:

$$Voo=(\text{Gain}*VCS)+V\text{offset}-V\text{offset(stored)}=\text{Gain}*Vcs. \quad (6)$$

The offset cancellation circuit may also be included within the amplifier circuit rather than at the output of the amplifier circuit, which, in use, may be connected to a controller. It may therefore be desirable in this case to implement an offset cancellation circuit within the amplifier circuit, due to currents from the controller potentially affecting the offset cancellation.

Figure 19:
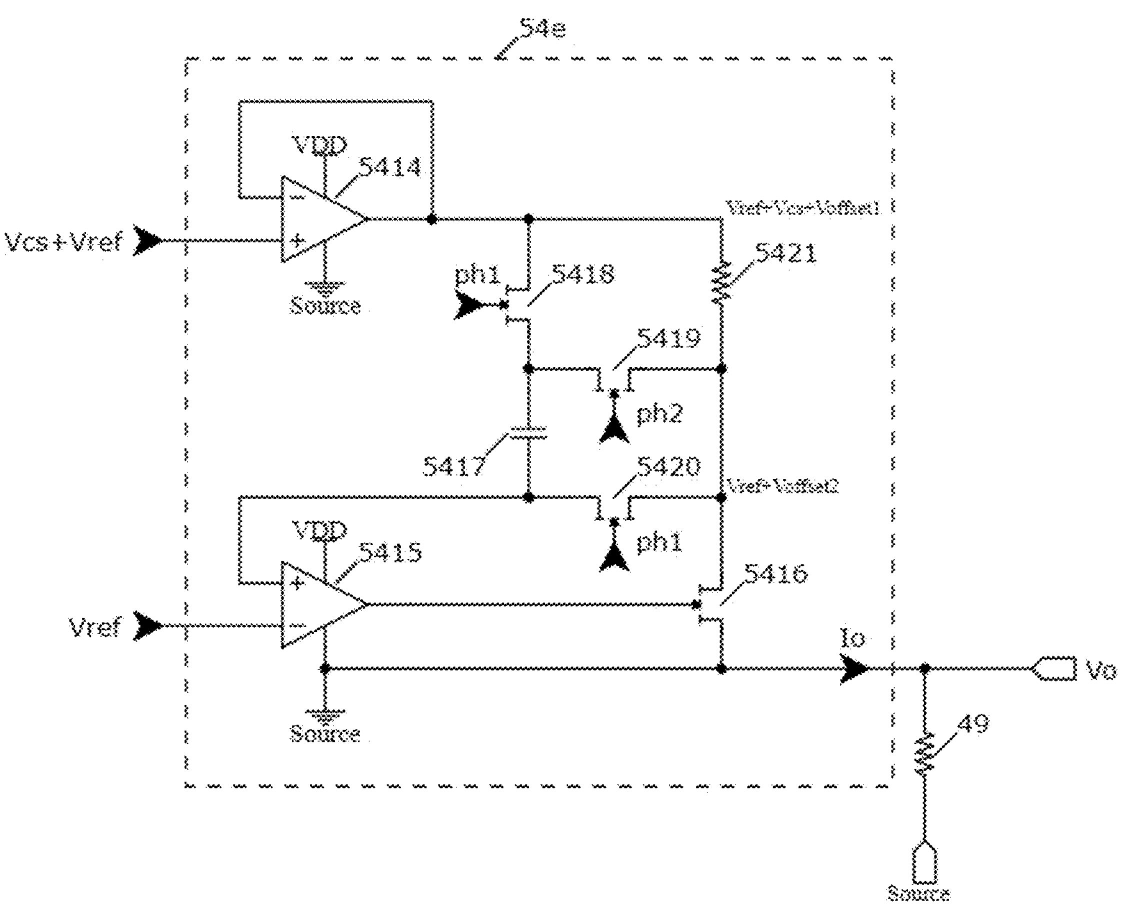
FIG. 19 depicts schematically an example amplifier comprising an offset cancellation circuit.

One example amplifier circuit 54*e* comprising an offset cancelation circuit 5417, 5418, 5419, 5420 is shown in FIG. 19. Similar to earlier example amplifiers 54*c* and *d*, amplifier 54*e* comprises two operational amplifiers 5414 and 5415. Ignoring, initially, the offset cancellation circuit components and offset signals, operational amplifier 5414 has the level shifted signal $V_{cs}+V_{ref}$ as an input to its non-inverting terminal ("+" input). Operational amplifier 5414 is connected in a voltage buffer configuration such that its output is $V_{cs}+V_{ref}$. Operational amplifier 5415, meanwhile, has the level shifted signal Vref as an input to its inverting terminal ("−" input). The output of the operational amplifier 5415 is connected to the gate terminal of transistor 5416, and the drain terminal of transistor 5416 is connected as feedback to the non-inverting terminal ("+" input) of amplifier 5415. The drain of transistor 5416 is therefore at the potential $V_{ref}$.

By selecting the value of resistance 5421, the current amplification/attenuation gain may be set in a similar manner to that of amplifier 54*d*.

Turning now to the offset cancellation circuit, this circuit comprises enhancement mode transistors 5418 and 5420 (with gate potential ph1) and 5419 (with gate potential ph2), and a capacitor 5417. The gates of the enhancement mode transistors 5418 and 5420 receive an inverted control signal such that when the potential applied to the gate of the main power transistor 19 is high, the potential applied to the gates of the enhancement mode transistors 5418 and 5420 are low, and vice versa. The gate of the enhancement mode transistor 5419 receives the power transistor control signal (or a conditioned version of the control signal), such when the potential applied to the gate of the main power transistor 19 is high, the potential applied to the gate of the enhancement mode transistor 5419 is also high, and vice versa.

When the potential applied to the gate of main power transistor 19 and current sense transistor 16 is low, a negligible current flows through the device. In this condition, the signal $V_{cs}$ is negligible and therefore the output of operational amplifier 5414 is $V_{ref}+V_{offset1}$ where $V_{offset1}$ is the input offset of operational amplifier 5414. Transistors 5418 and 5420 are 'on' in this mode of operation, and transistor 5419 is 'off'. Similarly, in this condition the drain of transistor 5416 is at $V_{ref}+V_{offset2}$, where $V_{offset2}$ is the input offset of operational amplifier 5415. As a result, during this period capacitor 5417 stores a potential equal to $V_{offset1}-V_{offset2}$.

When the gate of power transistor 19 and sense transistor 16 is high, current flows through the transistors and a $V_{cs}$ signal is produced. Transistor 5418 and 5420 are 'off' in this mode of operation and transistor 5419 is 'on', as described above. As a result, during this period the voltage across resistor 5421 ($V_{5421}$) is:

$$V_{5421}=Vref+Vcs+Voffset1-(Vref+Voffset2)-(Voffset1-Voffset2)=Vcs \quad (7)$$

This means that the operation amplifier offsets $V_{offset1}$ and $V_{offset2}$ have been cancelled, and the output current is only controlled by $V_{cs}$ and the choice of resistor 5421. The output voltage, $V_o$ can therefore be set through the choice of external resistor 49, as in the configuration of FIG. 17.

The amplifier circuits described above, and any other monolithically integrated circuits, may consume considerable power from VDD in operation. During the period of operation where the power device is in the commutation mode, and the power electronics circuit is delivering power to a load connected to its output, the power consumed by the amplifier circuit may be negligible compared to the power consumption of the overall system. However, in the case of no-load condition (i.e. when no load is connected to the output of the power electronics circuit), the power device may no longer be in commutation mode and may enter long periods in an off-state mode. In this context, regarding the period of off-state mode, a "long" refers to the length of the period of time spent in off-state mode being significantly greater than length of the periods of time where the power device is operating (switching) in commutation mode. The time spent continuously in the off-state during a no-load condition may be for example 100 times greater than the maximum continuous time spent in the off-state during the commutation mode. During the no-load condition, the power consumption of the integrated circuits may unacceptable or undesirable for the overall power dissipation requirements of the power electronics circuit. Thus, the III-nitride device may be configured to enter a stand-by mode in this condition and the circuits may be disabled.

Figure 20:
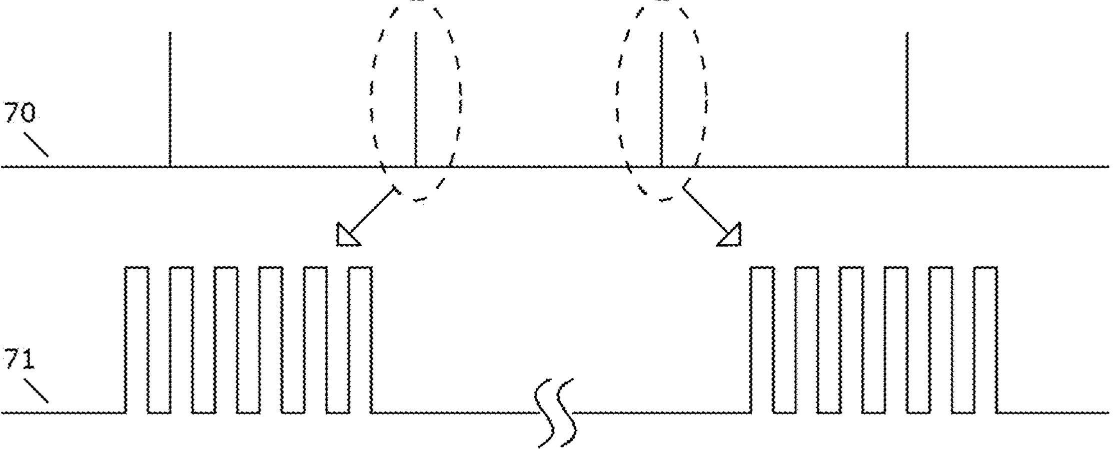
FIG. 20 depicts a burst mode operation for a control signal.

Additionally, the power electronics circuit may be operable in a Burst-mode. Burst-mode is an operational mode whereby the power system control circuit and switching circuit (and sometimes additional features) are intermittently disabled when the direct current (DC) load is particularly light, or completely absent (i.e. under a no load condition). The control signal during Burst-mode may appear as illustrated in FIG. 20. Burst mode may be defined as long periods of off-state mode operation (for example control signal is low), with graph 71 shown a zoomed in view of the intermittent pulses in the control signal 70.

Figure 21:
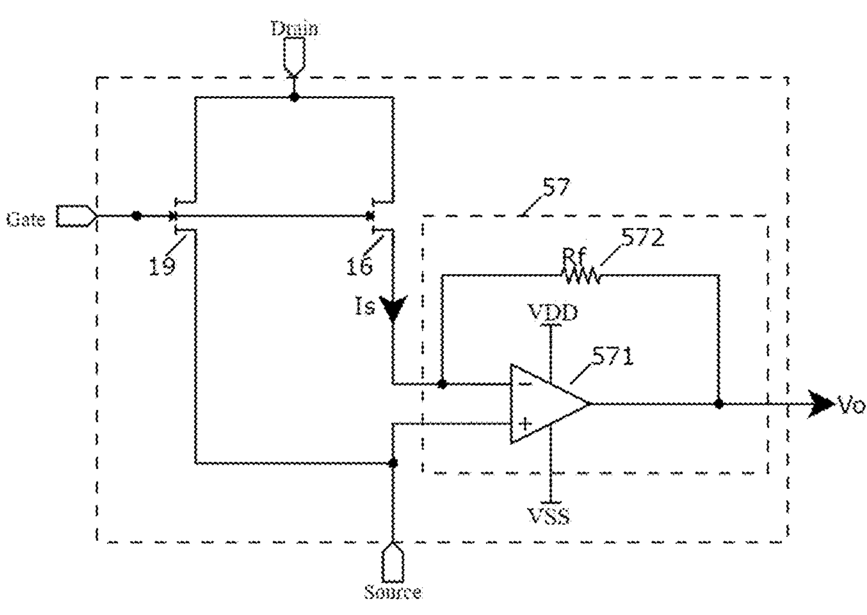
FIG. 21 depicts schematically a further example current sensing circuit according to an aspect of the present disclosure.

FIG. 21 shows an example of an alternative solution for maintaining a good sensitivity and linearity in a current sensing circuit. In this implementation, the current is sensed directly from the sensing transistor 16. The operational amplifier 571 maintains the positive and negative inputs at the same potential (i.e. the source potential). The output voltage Vo of the sensing circuitry 57 is therefore proportional to the current through the sensing transistor 16 and the feedback resistance Rf of resistor 572, such that:

$$V_o=-R_f*I_S \quad (8)$$

where $I_S$ the current though the sense transistor 16. It will be noted that in this example the output voltage is negative. The op-amp 571 in this configuration requires both positive and negative supply voltages. The negative supply can be provided using e.g. a charge pump circuit. In its simplest form the charge pump circuit may comprise diodes, capacitors and require a switching circuit. The op-amp and the feedback resistance can be (monolithically) integrated into the device, or can be provided externally.

Figure 22:
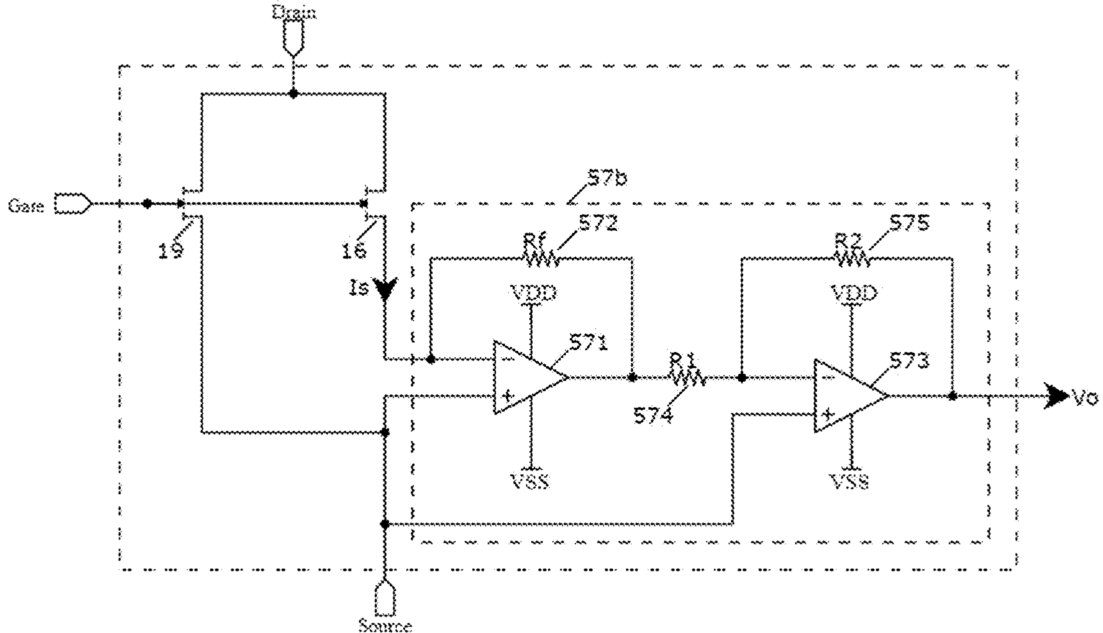
FIG. 22 depicts schematically a further example current sensing circuit according to an aspect of the present disclosure.

The sensing circuitry 57*b* of FIG. 22 is similar to sensing circuitry 57, but additionally comprises a second amplifier stage 573, 575 with a negative gain to convert the negative output of the first amplifier stage 571, 572 into a positive output voltage. The second amplifier stage 573, 575 is connected in series with the first amplifier stage 571, 572 and a resistor 574. Both amplifiers 571 and 573 can use the same positive and negative power supplies. Any of the components in circuit 57*b* can be integrated or provided externally. The output voltage of the circuit arrangement 57*b* is:

$$V_O=\frac{R_2}{R_1}*R_f*I_s \quad (9)$$

Where R1 and R2 are the resistances of the resistors 575 and 574 respectively, and $R_f*I_S$ is the magnitude of the output of the first amplifier stage.

Figure 23:
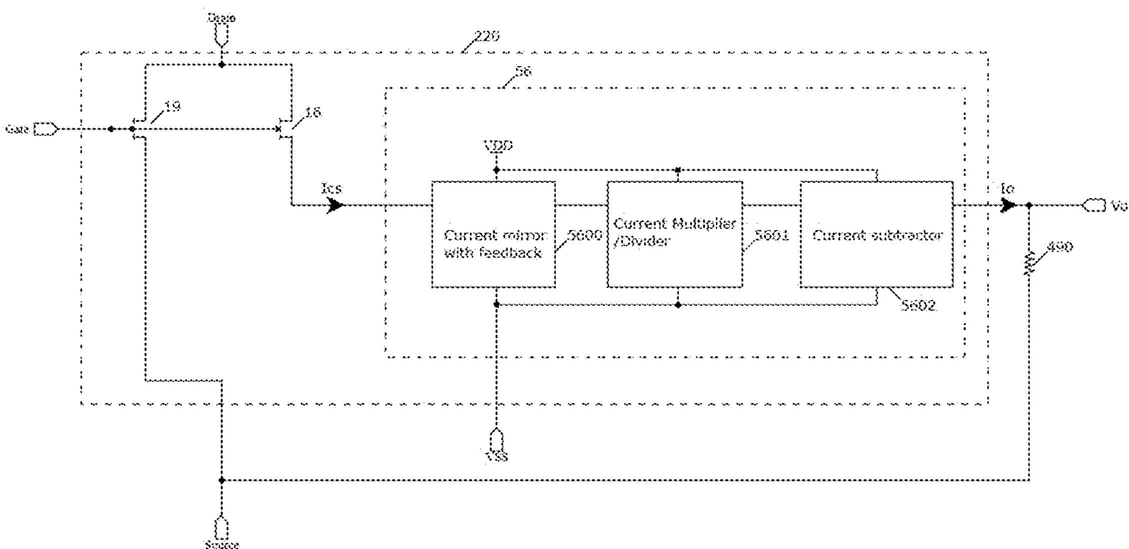
FIG. 23 depicts schematically a further example current sensing circuit according to an aspect of the present disclosure.

FIG. 23 shows a further alternative approach to achieve accurate current sensing. The sensing circuit 56 of FIG. 23 comprises a current mirror block 5600, a current multiplier/divider circuit block 5601, and a current subtractor circuit block 5602. As in FIGS. 21 and 22, sensing circuit 56 measures a current through the current sense transistor 16.

As described throughout this disclosure, for accurate current sensing it is generally desirable to maintain a constant current sharing ratio between the main power transistor 19 and the current sense transistor 16. In implementations described above, the solution proposed to maintain a good current sharing relationship between the power path and the sense path was to keep the sense resistor 15 small, which in turn results in a small $V_{cs}$ signal.

An alternative approach as depicted in FIG. 23 is to maintain the potential at the source of the sense transistor 16 at the same level as the potential at the source of the power transistor 19, at all times during sensing operations. The sensing current $I_{cs}$ may then flow across a source potential and a negative potential (i.e. a negative supply voltage) VSS. The sensing current $I_{cs}$ may be combined with a low biasing current $I_1$ (as described further with respect to FIGS. 24 and 25 below) to provide a current $I_S$. The negative potential VSS may be externally applied or generated internally to the device using e.g. integrated circuits. The negative supply can be supplied e.g. using a charge pump circuit. In its simplest form, a charge pump circuit is made of diodes, capacitors and requires a switching circuit.

The circuit block 5600 which produces and outputs the current $I_S$ may be defined as a current mirror with feedback. The current Is is then divided or multiplied, by multiplier/divider 5601 (which may also be implemented using e.g. a current mirror circuit). Finally, a current subtractor 5602 is provided to produce an output current of $I_S/n$, where "1/n" is the scaling factor applied by the multiplier/divider circuit 5601. Optionally, an external resistor 490 may be provided to convert the output current $I_S/n$ to an output voltage $V_O$, in the same manner as e.g. external resistor 49 of FIG. 17. The functionality of these circuit blocks 5600, 5601, 5602 will now be described in more detail, with reference to example configurations shown in FIGS. 24 and 25.

Figure 24:
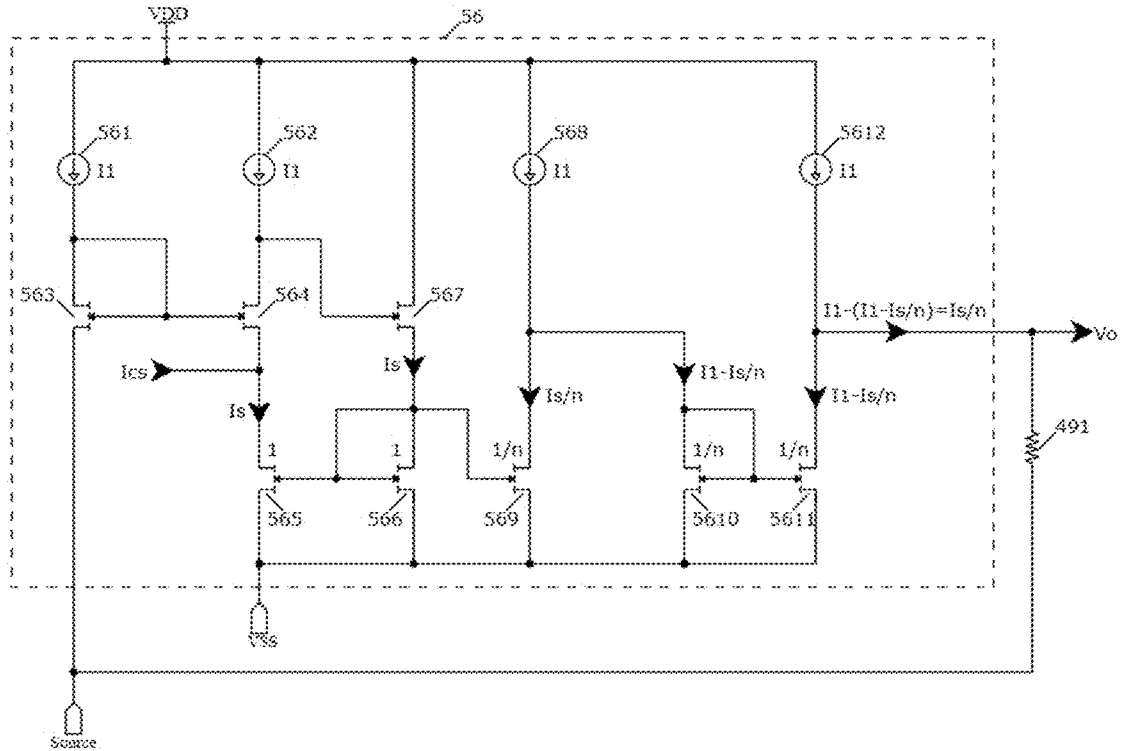
FIG. 24 depicts schematically an example current mirror, current divider and current subtractor circuits for use in a current sensing circuit.

FIG. 24 shows a first example configuration of a sensing circuit 56. The first stage of this circuit comprises a first gate-source connected transistor 563, a second transistor 564 with its gate terminal connected to the gate terminal of the first transistor 563, and current sources 561, 562. Together, these components form a circuit mirror. Transistors 563 and 564 are identical enhancement mode transistors. As a result, in order for an identical current $I_1$ to flow in both legs of the current mirror the source of enhancement mode transistor 564 must be at the same potential as the source of the enhancement mode transistor 563. A third enhancement mode transistor 565 is connected in series with transistor 564, and a current $I_S$ flows through the transistor between external source potential and the negative potential VSS. Current $I_S$ is formed by combining the input current $I_{CS}$ with the biasing current from the current mirror. The first stage of the circuit further comprises a third leg (consisting of transistors 566 and 567) which provides a feedback connection to the second leg of the current mirror, in order for the potential at the source of transistor 564 to be maintained at the external source potential. The gate terminal of transistor 567 is connected to the second leg such that any changes to the potential distribution in the second leg adjust the current flowing in the third leg. Transistor 566 is connected in a current mirror configuration with transistor 565 such that, if transistor 565 and 566 are of the same size (for example in terms of gate terminal perimeter), then the current $I_s$ flowing in transistor 565 will be mirrored in transistor 566. This means that, as the external source terminal (i.e. the source terminal of the main power transistor 19) is connected to the source of transistor 563, while the source of the sense transistor 16 is connected to the source of transistor 564, the current mirror aids in maintaining the potential at the source of the current sense transistor 16 at the same level as potential of the external source terminal.

The second stage of the circuit 56 forms a current divider, which in this configuration is implemented through an additional current mirror. The current divider comprises transistor 566 and transistor 569, which are connected in a current mirror configuration. Transistor 566 and 569 may have an identical, with transistor 569 being smaller (for example in terms of gate perimeter or device area) than transistor 566 by a ratio of 'n'. As transistor 569 is smaller than transistor 566 by a scale factor of n, and as the source terminals of transistors 566 and 569 are both fixed at the same potential VSS, transistor 569 draws a current of $I_s/n$. It will be understood that the current divider may instead be used as a current multiplier with a current $n*I_S$ drawn by transistor 569, if transistor 569 is instead larger than transistor 566 by a ratio of 'n'.

The third stage of the circuit comprises enhancement mode transistors 5610 and 5611, and current sources 568, 5612 as illustrated. These components form a current subtractor circuit, formed form a further current mirror circuit. As transistor 569 draws a current of $I_s/n$, a current of $I_1-I_s/n$ is provided to transistor 5610 (as the total current in for these transistors is fixed at $I_1$ by current source 568). As transistors 5610 and 5611 are identical transistors, and the source terminals for transistors 5610 and 5611 are fixed at the same (VSS) potential, this means that transistor 5611 draws an equal current, resulting in (as the total current in the fifth circuit leg is fixed at $I_1$ by current source 5612) an output current $I_O$ of:

$$I_I = I_1 - \left(I_1 - \frac{I_S}{n}\right) = \frac{I_S}{n} \quad (10)$$

the current subtractor therefore provides an output current for the sensing circuit 56 of $I_s/n$ to a node connected to an external pad. The function of the current subtractor is therefore to convert a sinking current level to a sourcing current level. Optionally, the output sense current may be converted to an output voltage via the inclusion of a resistor 491 connected externally between the external pad and the external source.

In a further example, the first and second stages (comprising current mirror 5600 and current divider 5601) may be combined such that the functions of mirroring the sense current while maintaining a fixed potential at the source of the sense transistor and dividing the sense current are performed in a single stage. This configuration is shown in FIG. 25.

Figure 25:
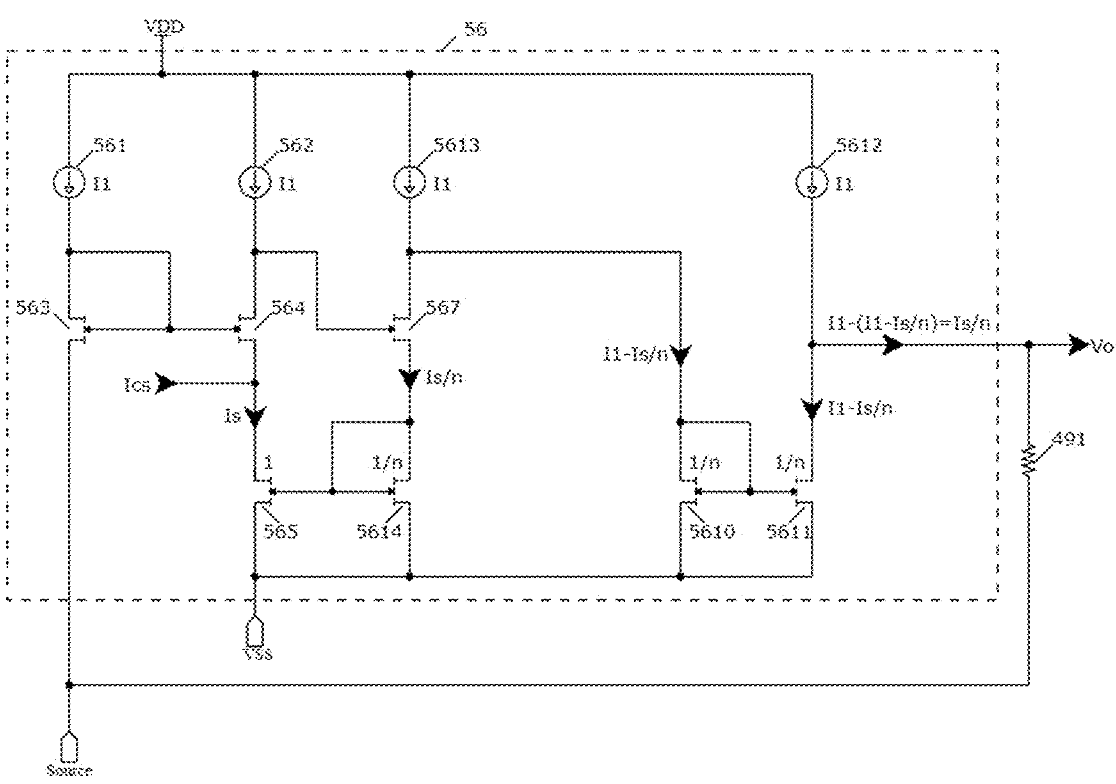
FIG. 25 depicts schematically a further example current mirror, current divider and current subtractor circuits for use in a current sensing circuit.

Sensing circuit 56 in FIG. 25 is similar to the example in FIG. 24, however in this example transistor 566 is replaced by a transistor 5614. Like transistor 566, transistor 5614 has an identical structure to transistor 565. Unlike transistor 566 however, transistor 5614 is not the same size as transistor 565, and instead its size (for example in terms of gate perimeter or device area) is 'n' times smaller than transistor 566, As the source terminals of transistors 565 and 5614 are both fixed at the potential VSS, this means that transistor 5614 draws a current of $I_S/n$. A third current subtractor stage is also provided, which is structured and operates identically to that described above with reference to FIG. 24.

Figure 26:
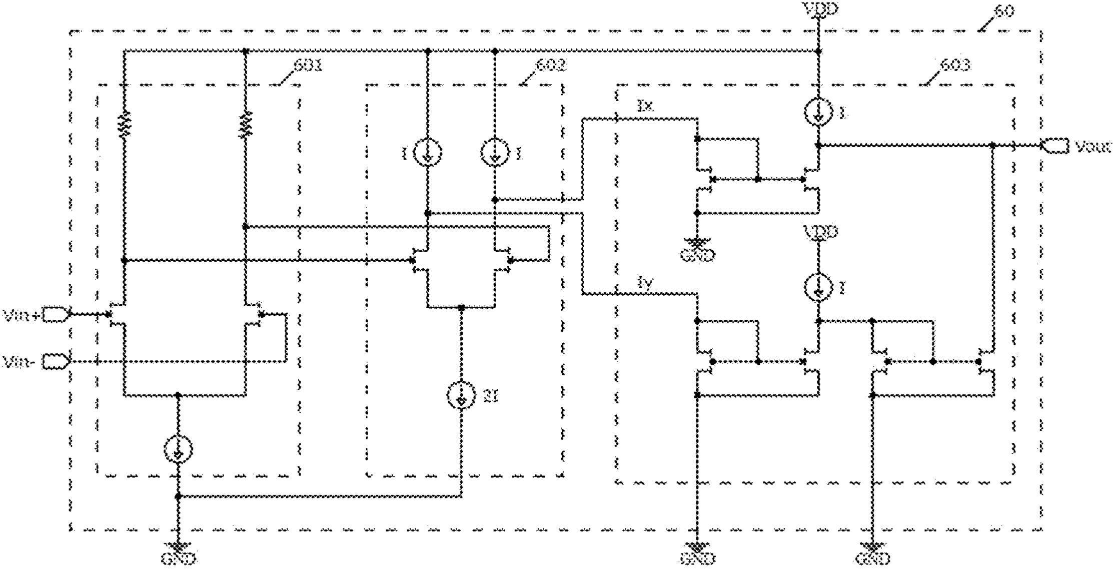
FIG. 26 depicts schematically an example operational amplifier structure.

Many of the example implementations described above utilise integrated operational amplifiers. One example of an integrated operational amplifier 60 is illustrated in FIG. 26.

Operational amplifier 60 comprises a an initial inverting differential amplifier stage 601, a tranconductance amplifier stage 602 and a current subtractor stage 603. The circuit is configured to receive an input signal $V_{in+}$ and a (fixed) reference voltage $V_{in-}$, along with a fixed voltage VDD, and provide an output voltage $V_{out}$. The fixed voltages may be generated on chip or applied externally.

Differential amplifier 601 may be implemented using a differential pair (also known as long-tailed pair) comprising two enhancement mode transistors, two resistors and a current source. The differential amplifier generally performs two main functions in this circuit. It provides amplification of the comparator differential input signal ($V_{in+}-V_{in-}$) and sets the bias point for the next stage, biasing the transconductance amplifier stage 602 in a high gain region.

The transconductance amplifier 602 receives a differential input voltage from the differential amplifier 601 and provides a differential current output (Ix, Iy) to the current subtractor stage 603. The transconductance amplifier comprises a differential pair with two enhancement mode transistors and current sources.

The current subtractor stage may be implemented using current mirroring circuits comprising two gate-gate connected transistors, as previously described, such that when Ix−Iy is negative then $V_{out}$ is high, and when Ix−Iy is positive then $V_{out}$ is low.

The transconductance amplifier stage 602 and current subtractor stage 603 allow a rail-to-rail comparator output. Rail-to-rail in this example refers to VDD as a high output and ground reference as a low output.

It will be understood that a negative VSS potential may be applied in place of the ground references shown in FIG. 26.

In all the implementations and examples described in this disclosure, a Kelvin contact may be provided instead of the source contact for the main power device (i.e. transistor 19), to further improve the accuracy of the current sensing signal. Further, and again in all examples presented herein, the output current sensing node may be an external node, or the current sensing signal may only be used internally (i.e. on-chip), for example in a fast response current overprotection circuit. Equally, in all implementations described above, the gate terminal of the main power device may be connected to an external gate driver, integrated gate driver or to any other gate drive interface circuit, such as the gate driver(s) depicted in published PCT application WO2020/225362.

LIST OF REFERENCE NUMERALS

8 Source Terminal
9 Drain Terminal
10 Gate Terminal
11 Gate Layer
13 Depletion Region
14 Enhancement mode Transistor
15 Sensing Load
16 Sensing Transistor
19 Main Transistor
41 Controller/microprocessor unit
42 Gate driver
43 Integrated feedback circuit
44 Sensing Transistor
46 Resistor
49 External Resistor
50 Amplifier
51 Level Shifter Circuit
51*a* Level Shifter Circuit
52 Amplifier
53 Bridge Circuit
53*a-c* Bridge Circuit
54 Amplifier Circuit
54*a-d* Amplifier Circuit
55 Off-Set Cancellation Circuit
56 Sensing Circuit
57 Sensing Circuit
57*b* Sensing Circuit
60 Operational Amplifier
70 Control Signal
71 Graph
110*a* GaN Chip
210 Power Device
220 Power Device
490 External Resistor
491 Resistor
511 Depletion Mode Transistor
512 Resistor
531 Resistor
532 Resistor
533 Depletion Mode Transistor
534 Depletion Mode Transistor
535 Current Source
536 Current Source
537 Diode
538 Diode
539 Diode
541 Differential Amplifier
542 Enhancement mode Transistor
543 Potential Divider
544 Resistor
545 Resistor
546 Operational Amplifier
547 Operational Amplifier
548 Resistor
549 Resistor
551 Resistor
552 Capacitor
553 Capacitor
554 Enhancement mode Transistor
561 Current Source
562 Current Source
563 Enhancement Mode Transistor
564 Enhancement Mode Transistor
565 Enhancement Mode Transistor
566 Transistor
567 Transistor
568 Current Source
569 Transistor
571 Operational Amplifier
572 Resistor
573 Amplifier
574 Resistor
575 Amplifier
601 Differential Amplifier
602 Transconductance Amplifier
603 Current Subtractor
801 p+ Region
802 Active Area
803 Source Terminal
804 Drain Terminal
805 n-Type Layer
806 p-Type Layer
807 Transition Layer
808 Substrate
809 Source Terminal
810 Gate Terminal
811 pGaN Region
812 Drain Terminal

813 Source Terminal
814 Gate Terminal
815 pGaN Region
816 Drain Terminal
817 Conduction Layer
818 Insulating Layer
819 p+ Region
5310 Diode
5311 Resistor
5312 Resistor
5410 Operational Amplifier
5411 Operational Amplifier
5412 Resistor
5413 Enhancement Mode Transistor
5414 Operational Amplifier
5415 Operational Amplifier
5416 Transistor
5417 Capacitor
5418 Enhancement Mode Transistor
5419 Enhancement Mode Transistor
5420 Enhancement Mode Transistor
5421 Resistor
5422 Enhancement Mode Transistor
5423 Differential Amplifier
5600 Current Mirror Block
5601 Current Multiplier/Divider Circuit Block
5602 Current Subtractor Circuit Block
5610 Enhancement Mode Transistor
5611 Enhancement Mode Transistor
5612 Current Source
5613 Current Source
5614 Transistor In this disclosure, unless explicitly specified, the heterojunction transistors may be any known transistor based on a heterojunction such as a p-Gate HEMT transistor, or a Schottky gate transistor or an insulated gate transistor such as MISFET (Metal Insulating Semiconductor Field Effect Transistor). The diodes can be Schottky diodes, Zener diodes or pn diodes or diodes made of a transistor by connecting the gate terminal with any of its other terminals. The heterojunction chip or the heterojunction power device described in this disclosure can be referred to as a heterojunction smart power device or heterojunction smart chip or heterojunction power integrated circuit or heterojunction integrated circuit.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. An III-nitride power semiconductor based heterojunction device comprising:

a first heterojunction transistor comprising a first drain terminal, a first source terminal and a first gate terminal;

a second heterojunction transistor comprising a second drain terminal, a second source terminal and a second gate terminal, wherein the second drain terminal is operatively connected to the first drain terminal, the second gate terminal is operatively connected to the first gate terminal;

a resistive load comprising a first terminal operatively connected to the first source terminal and a second terminal operatively connected to the second source terminal;

a monolithically integrated level shifting stage configured to receive an input signal corresponding to a signal across the resistive load and output a level shifted signal that corresponds to the input signal;

an amplifier stage configured to receive the level shifted signal as an input and provide an output signal to an output node of the heterojunction device, wherein the output signal of the amplifier stage is proportional to the signal across the resistive load; and wherein the second heterojunction transistor has a substantially identical structure to the first heterojunction transistor, and wherein the second heterojunction transistor is scaled to a smaller area or gate perimeter than the first heterojunction transistor by a scale factor X, where X is larger than 1;

wherein the level shifting stage comprises a bridge circuit, the bridge circuit comprising a first leg and a second leg;

wherein the first leg comprises a first level shifter configured to receive the input signal corresponding to the signal across the resistive load and output the level shifted signal;

wherein the second leg comprises a second level shifter configured to output a reference signal; and wherein the second level shifter comprises at least one component which is matched or ratiometrically matched in geometry and performance to a component within the first level shifter;

wherein the amplifier stage comprises a differential amplifier structure; and wherein the differential amplifier structure is configured to receive the level shifted signal as a first input and the reference signal as a second input.

2. The heterojunction device of claim 1, wherein the output signal of the amplifier stage is a current signal, and wherein the heterojunction device is connected or connectable an output resistor, the output resistor is configured to convert the current signal to an output voltage with a magnitude proportional to a resistance of the output resistor.

3. The heterojunction device of claim 2, wherein the output resistor is operatively connected between the output node and the first source terminal; and wherein the resistance of the output resistor is substantially constant with respect to temperature across a temperature range of about-55 degrees Celsius to about 150 degrees Celsius.

4. The heterojunction device of claim 1, wherein the device comprises:

a heterojunction comprising a two dimensional carrier gas; and one or more isolation regions configured to reduce an interference between two or more of the first heterojunction transistor, the level shifting stage and/or the amplifier stage, wherein the isolation regions do not comprise the two dimensional carrier gas.

5. The heterojunction device of claim 1, wherein the amplifier stage comprises one or more monolithically integrated operational amplifiers, voltage repeaters, resistors and/or capacitors; and wherein the output signal of the amplifier stage is proportional to a current or voltage across the resistive load.

6. The heterojunction device of claim 5, wherein the amplifier structure comprises at least two resistive structures, wherein the at least two resistive structures are ratiometrically matched and formed in a same layer of the heterojunction device, such that a resistance of each of the two resistive structures have approximately the same variability with respect to temperature or process variations.

7. The heterojunction device of claim 1, wherein the level shifting stage comprises at least one of:

(i) one or more low voltage diodes operatively connected in series, and/or (ii) one or more gate-source connected enhancement mode transistors operatively connected in series.

8. The heterojunction device of claim 1, wherein the level shifting stage comprises one or more low voltage depletion mode transistors; and wherein the level shifting stage is configured to amplify the input signal such that the level shifted signal corresponds to an amplified input signal.

9. The heterojunction device of claim 8, wherein the one or more low voltage depletion mode transistors comprise a source terminal, a drain terminal, and a plurality of highly doped semiconductor regions spaced apart from each, the plurality of highly doped semiconductor regions positioned between the source terminal and the drain terminal; and wherein the plurality of highly doped semiconductor regions are configured to increase a length of a current path between the source terminal and the drain terminal.

10. The heterojunction device of claim 1, further comprising an offset cancellation circuit configured to remove an offset signal from the output signal of the amplifier stage.

11. The heterojunction device of claim 10, wherein the offset cancellation circuit is monolithically integrated in the amplifier stage of the heterojunction device.

12. The heterojunction device of claim 10, wherein the offset cancellation circuit is configured to receive the output signal of the amplifier stage as an input and output a corrected output signal.

13. The heterojunction device of claim 10, wherein the offset cancellation circuit comprises at least one of an enhancement mode transistor, a depletion mode transistor, a resistor and/or a capacitor.

14. The heterojunction device of claim 1, comprising a monolithically integrated stand-by circuit configured to detect when the device is operating under a no load condition, and, in response to the detection, to generate a stand-by signal to lower a power consumption of at least one of the level shifting stage or the amplifier stage.

15. The heterojunction device of claim 1, wherein the at least one component of the second level shifter is separated from the component within the first level shifter to which is matched or ratiometrically matched in geometry and performance by a distance of 100 μm or less.

16. The heterojunction device of claim 1, wherein the first leg and the second leg each comprise upper and lower parts, and a mid-point between the upper and lower parts, wherein the differential amplifier structure is configured to receive the first and second inputs from the mid-points of the first and second legs respectively, and wherein the lower part of the first leg comprises one or more components, the one or more components selected from a diode, a transistor connected in a diode configuration, a resistor, a depletion mode transistor; and the one or more components comprise either the resistive load or a component controlled by a voltage drop across the resistive load;

wherein the lower part of the second leg comprises at least one component that is matched or ratiometrically matched to the one or more components of the lower part of the first leg.

17. The heterojunction device of claim 1, wherein the first leg and the second leg each comprise upper and lower parts, and a mid-point between the upper and lower parts, wherein the differential amplifier structure is configured to receive the first and second inputs from the mid-points of the first and second legs respectively, and wherein the upper part of the first leg comprises one or more components, the one or more components selected from a resistor, a depletion mode transistor connected in a resistive configuration, and a current source;

wherein the upper part of the second leg comprises at least one component that is identical, matched or ratiometrically matched to the one or more components of the upper part of the first leg.

18. The heterojunction device of claim 1, wherein the first leg and the second leg each comprise upper and lower parts, and a mid-point between the upper and lower parts, wherein the differential amplifier structure is configured to receive the first and second inputs from the mid-points of the first and second legs respectively;

wherein the differential amplifier structure comprises at least one operational amplifier configured to receive the first and second inputs; and wherein the amplifier stage further comprises at least one transistor and a potential divider, wherein the potential divider comprises an upper side and a lower side and a mid-point between the upper and lower sides, each of the upper and lower sides comprising at least one resistive component, and wherein the upper side of the potential divider is operatively connected to the output node.

19. The heterojunction device of claim 1, wherein the first leg comprises a first low-voltage depletion mode transistor, wherein a gate terminal of the first low-voltage depletion mode transistor is operatively connected to the second terminal of the resistive load; and wherein the second leg comprises a second low-voltage depletion mode transistor matched or ratiometrically matched to the first low-voltage depletion mode transistor, wherein either:

(i) a gate terminal of the second low-voltage depletion mode transistor is operatively connected to the first source terminal; or (ii) the amplifier stage further comprises at least one transistor and a potential divider, and the gate terminal of the second low-voltage depletion mode transistor is operatively connected to a mid-point of the potential divider.

20. The heterojunction device of claim 1 wherein the differential amplifier structure comprises at least one resistive component which is configured to convert a voltage drop between repeated potentials of the first and second legs into the output signal of the amplifier stage, wherein the output signal of the amplifier stage is a current signal with a magnitude that is inversely proportional to a resistance of the resistive component.

21. The heterojunction device of claim 1 wherein the differential amplifier structure comprises one or more of an operational amplifier with a gain factor greater than 1, and/or a buffer with a gain factor of approximately 1.

22. The heterojunction device of claim 1, wherein the first and second legs are operatively connected to a first DC voltage source at first end; and wherein a second end of the first and second legs is operatively connected the first source terminal or to a second DC voltage source with a lower potential than the first DC voltage source.

23. The heterojunction device of claim 1, wherein the first leg and the second leg each comprise upper and lower parts, and a mid-point between the upper and lower parts, wherein the differential amplifier structure is configured to receive the first and second inputs from the mid-points of the first and second legs respectively; and wherein the bridge circuit is configured such that a potential at the mid-point of the first leg is equal to a potential at the mid-point of the second leg when a current through the first heterojunction transistor is nil.

24. The heterojunction device of claim 1, wherein:

the first leg comprises at least one first depletion mode transistor, wherein a gate terminal of the at least one first depletion mode transistor is operatively connected to the second terminal of the resistive load;

the second leg comprises at least one second depletion mode transistor, wherein the at least one second depletion mode transistor is matched or ratiometrically matched in geometry and performance to the at least one first depletion mode transistor;

the differential amplifier structure comprises at least one operational amplifier configured to receive the first input and the second input, wherein an output of the at least one operational amplifier is indirectly connected to the output node via at least one other component;

wherein the amplifier stage further comprises at least one transistor and a potential divider, wherein the potential divider comprises at least two resistive components ratiometrically matched in geometry and performance and configured such that a gain of the amplifier stage is proportional to a resistance ratio of the two resistive components; and wherein the potential divider comprises an upper side and a lower side and a mid-point between the upper and lower sides, each of the upper and lower sides comprising one or more of the at least two resistive components, wherein the upper side is operatively connected to the output node and the mid-point is operatively connected to a gate terminal of the at least one second depletion mode transistor.

25. The heterojunction device of claim 1, wherein:

the first leg comprises the resistive load operatively connected in series with the first level shifter;

the second leg comprises a reference resistive component operatively connected in series with the second level shifter, wherein the reference resistive component is matched or ratiometrically matched in geometry and performance to the resistive load;

the differential amplifier structure comprises at least one operational amplifier configured to receive the first input and the second input, wherein an output of the at least one operational amplifier is indirectly connected to the output node via at least one other component;

wherein the amplifier stage further comprises at least one transistor and a potential divider, wherein the potential divider comprises at least two resistive components ratiometrically matched in geometry and performance and configured such that a gain of the amplifier stage is proportional to a resistance ratio of the two resistive components.

26. The heterojunction device of claim 1, wherein:

the first leg comprises the resistive load operatively connected in series with the first level shifter;

the second leg comprises a reference resistive component operatively connected in series with the second level shifter, wherein the reference resistive component is matched or ratiometrically matched in geometry and performance to the resistive load;

the differential amplifier structure comprises at least one operational amplifier configured to receive the first input and the second input, wherein an output of the at least one operational amplifier is indirectly connected to the output node via at least one other component; and the differential amplifier structure comprises at least one resistive component which is configured to convert a voltage drop between repeated potentials of the first and second legs into the output signal of the amplifier stage, wherein the output signal is a current signal with a magnitude that is inversely proportional to a resistance of the resistive component.

27. The heterojunction device of claim 26, further comprising an output resistor configured to convert the current signal to an output voltage with a magnitude proportional to a resistance of the output resistor and/or a current through the first heterojunction transistor.

28. The heterojunction device of claim 1, wherein the level shifted signal output by the level shifting stage corresponds to the input signal with a voltage shift of 1V or more.

29. The heterojunction device of claim 1, wherein the amplifier stage is monolithically integrated in the heterojunction device.

* * * * *